(12) United States Patent
Eldredge et al.

(10) Patent No.: US 8,972,674 B2
(45) Date of Patent: *Mar. 3, 2015

(54) COMPENSATION FOR SOLID STATE STORAGE

(71) Applicant: Benhov GmbH, LLC, Wilmington, DE (US)

(72) Inventors: Kenneth J. Eldredge, Boise, ID (US); Stephen P. Van Aken, Boulder, CO (US)

(73) Assignee: Benhov GmbH, LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/147,453

(22) Filed: Jan. 3, 2014

(65) Prior Publication Data

US 2014/0189219 A1 Jul. 3, 2014

Related U.S. Application Data

(63) Continuation of application No. 13/543,191, filed on Jul. 6, 2012, now Pat. No. 8,650,376, which is a continuation of application No. 12/975,153, filed on Dec. 21, 2010, now Pat. No. 8,219,773, which is a (Continued)

(51) Int. Cl.
| | | |
|---|---|---|
| *G06F 13/00* | (2006.01) | |
| *G06F 12/02* | (2006.01) | |
| *G11C 11/56* | (2006.01) | |

(52) U.S. Cl.
CPC ............ *G06F 12/0246* (2013.01); *G11C 11/56* (2013.01); *G11C 11/5628* (2013.01); *G11C 11/5642* (2013.01); *G11C 2211/5641* (2013.01)
USPC ............. 711/154; 711/103; 711/170; 712/14; 712/37; 365/104; 365/212; 365/189.011; 365/210.14

(58) Field of Classification Search
CPC .. G06F 3/0679; G06F 3/0688; G06F 12/0238
USPC ...................... 711/103, 154, 173; 712/14, 37; 365/104, 189.011, 210.14, 212
See application file for complete search history.

(56) References Cited

U.S. PATENT DOCUMENTS

| | | |
|---|---|---|
| 5,485,422 A | 1/1996 | Bauer et al. |
| 5,541,886 A | 7/1996 | Hasbun |

(Continued)

FOREIGN PATENT DOCUMENTS

| | | |
|---|---|---|
| EP | 1343172 | 9/2003 |
| JP | 9288896 | 11/1997 |

(Continued)

OTHER PUBLICATIONS

International Search Report, PCT/US2007/075293, mailed Mar. 21, 2008, 1 page.

(Continued)

*Primary Examiner* — Reba I. Elmore
(74) *Attorney, Agent, or Firm* — Perkins Coie LLP

(57) ABSTRACT

A method and system for storing and retrieving data using flash memory devices. One example system includes an apparatus within a flash memory configuration. The flash memory configuration includes a plurality of memory cells, where each memory cell has a charge storage capacity for use in implementing digital storage. The apparatus includes a processing arrangement configured to access each of the memory cells in a write operation and a read operation. The apparatus also includes an instruction set for instructing the processor to impose target charge levels for defining a plurality of data values for each of the memory cells. The target charge levels are programmably movable with respect to the charge storage capacity.

20 Claims, 11 Drawing Sheets

Related U.S. Application Data continuation of application No. 11/834,565, filed on Aug. 6, 2007, now Pat. No. 7,877,564.

(60) Provisional application No. 60/886,926, filed on Jan. 27, 2007, provisional application No. 60/863,950, filed on Nov. 1, 2006, provisional application No. 60/843,117, filed on Sep. 9, 2006, provisional application No. 60/835,624, filed on Aug. 5, 2006.

(56) References Cited

U.S. PATENT DOCUMENTS

| | | | |
|---|---|---|---|
| 6,310,814 B1 | 10/2001 | Hampel et al. | |
| 6,625,055 B1 | 9/2003 | Smith et al. | |
| 6,842,375 B1 | 1/2005 | Raszka | |
| 7,046,544 B1 | 5/2006 | Shimanek | |
| 7,215,563 B2 * | 5/2007 | Brandon et al. | 365/94 |
| 7,877,564 B2 * | 1/2011 | Eldredge et al. | 711/163 |
| 8,219,773 B2 * | 7/2012 | Eldredge et al. | 711/163 |
| 8,650,376 B2 * | 2/2014 | Eldredge et al. | 711/163 |
| 8,661,184 B2 * | 2/2014 | Wood et al. | 711/100 |
| 2004/0141394 A1 * | 7/2004 | Nishida et al. | 365/203 |
| 2005/0071731 A1 | 3/2005 | Atri et al. | |
| 2005/0086574 A1 | 4/2005 | Fackenthal | |
| 2005/0135165 A1 | 6/2005 | Smith et al. | |
| 2005/0276101 A1 | 12/2005 | Chen et al. | |
| 2006/0120165 A1 | 6/2006 | Hemink | |
| 2006/0155920 A1 * | 7/2006 | Smith et al. | 711/103 |
| 2007/0153575 A1 * | 7/2007 | Cohen | 365/185.11 |
| 2008/0013380 A1 | 1/2008 | Cornwell et al. | |
| 2008/0055987 A1 | 3/2008 | Ruf et al. | |
| 2008/0147964 A1 | 6/2008 | Chow et al. | |

FOREIGN PATENT DOCUMENTS

| | | |
|---|---|---|
| JP | 2000251484 | 9/2000 |
| JP | 2003100099 | 4/2003 |
| KR | 10-0271943 | 11/2000 |
| WO | WO-9534074 | 12/1995 |
| WO | WO-2006043225 | 4/2006 |
| WO | WO-2008019347 | 2/2008 |

OTHER PUBLICATIONS

International Bureau, Written Opinion, PCT/US2007/075293, mailed Mar. 21, 2008, 7 pages.

European Patent Office, Supplementary European Search Report and Opinion, EP07813821, Jul. 20, 2009, 6 pages.

European Patent Office, Examination Report, EP07813821, Oct. 13, 2009, 1 page.

European Patent Office, Examination Report, EP07813821, Oct. 4, 2010, 4 pages.

European Patent Office, Examination Report, EP07813821, Oct. 11, 2011, 4 pages.

Korean Intellectual Property Office, Office Action, KR10-2009-7004626, mailed Oct. 28, 2010, 9 pages.

United States Patent and Trademark Office, Non-Final Office Action, U.S. Appl. No. 11/834,565, mailed Mar. 30, 2010, 16 pages.

United States Patent and Trademark Office, Notice of Allowance, U.S. Appl. No. 11/834,565, mailed Sep. 14, 2010, 4 pages.

United States Patent and Trademark Office, Notice of Allowability, U.S. Appl. No. 11/834,565, mailed Dec. 28, 2010, 2 pages.

United States Patent and Trademark Office, Non-Final Office Action, U.S. Appl. No. 12/975,153, mailed Mar. 2, 2011, 19 pages.

United States Patent and Trademark Office, Final Office Action, U.S. Appl. No. 12/975,153, mailed Oct. 24, 2011, 6 pages.

United States Patent and Trademark Office, Notice of Allowance, U.S. Appl. No. 12/975,153, mailed Mar. 12, 2012, 6 pages.

United States Patent and Trademark Office, Non-Final Office Action, U.S. Appl. No. 13/543,191, mailed Jun. 6, 2013, 11 pages.

United States Patent and Trademark Office, Notice of Allowance, U.S. Appl. No. 13/543,191, mailed Oct. 3, 2013, 7 pages.

* cited by examiner

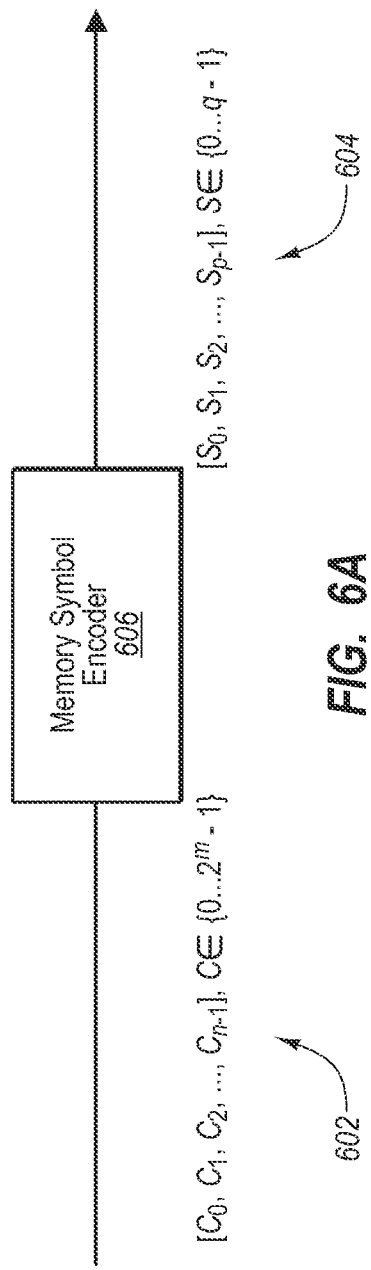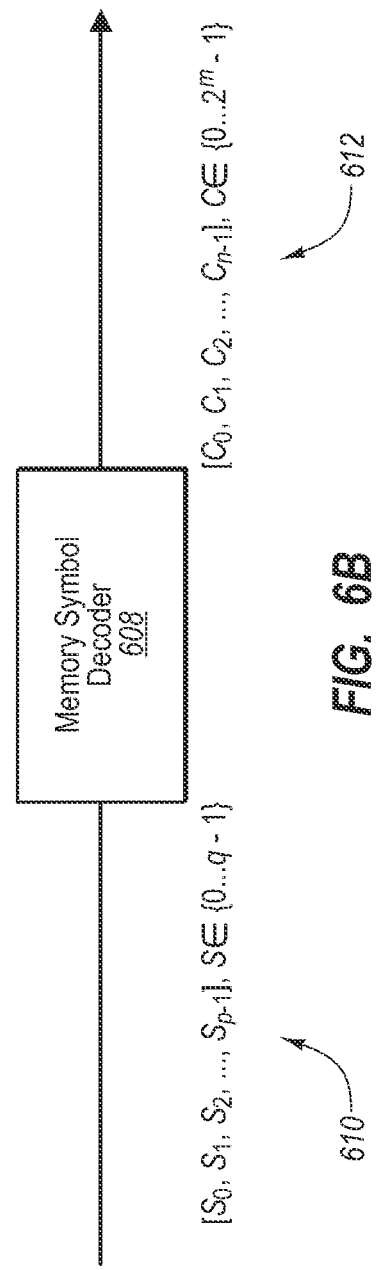
FIG. 6A
FIG. 6B

COMPENSATION FOR SOLID STATE STORAGE

CROSS-REFERENCE TO RELATED APPLICATIONS

This application is a continuation of U.S. patent application Ser. No. 13/543,191, filed Jul. 6, 2012, now issued U.S. Pat. No. 8,650,376, which is a continuation of U.S. patent application Ser. No. 12/975,153, filed Dec. 21, 2010, now issued U.S. Pat. No. 8,219,773, which is a continuation of U.S. patent application Ser. No. 11/834,565, filed on Aug. 6, 2007, now issued U.S. Pat. No. 7,877,564, which claims the benefit of the following:

U.S. Provisional Application No. 60/835,624, entitled Flash Hard Drive and Method and filed Aug. 5, 2006;

U.S. Provisional Application No. 60/843,117, entitled SSD Memory Controller and filed Sep. 9, 2006;

U.S. Provisional Application No. 60/863,950, entitled Solid State Storage Element and Method and filed Nov. 1, 2006; and U.S. Provisional Application No. 60/886,926, entitled Solid State Storage Element and Method and filed Jan. 27, 2007;

The foregoing applications are incorporated herein by reference in their entirety.

BACKGROUND OF THE INVENTION

1. The Field of the Invention

The present invention relates generally to a digital device architecture. More specifically, the present invention relates to a digital system configuration and associated method for devices including a Solid State Storage Element.

2. The Relevant Technology

One need only briefly survey virtually any public area in modern society in order to gain an appreciation for the popularity of electronic devices. Such devices include, but are not limited to cellular phones, music players, portable computers, personal digital assistants, pagers, digital cameras, digital camcorders, personal gaming devices and e-books. Continuous improvement has been seen in the capabilities present in these devices attributable, at least in part, to a movement into digital implementations.

Demands, with regard to future electronic devices, include further miniaturization coupled with still further improvements in performance. A particular area of concern resides in a desire to store ever-increasing amounts of digital information. In an attempt to cope with the need for a significant amount of digital data storage, designers increasingly use electronic memory, particularly in the form of flash memory. This solution is evident in the instance of state-of-the-art music players, including MP3 players.

In an attempt to increase data storage while maintaining a small storage size, some modern flash memory technology is capable of storing multiple data levels within a single memory cell, as opposed to simply storing binary ones and zeros. However, where multiple data levels can be stored within a single memory cell, the flash memory becomes more prone to errors when performing read and write operations. Furthermore, conventional flash technology utilizing multiple data levels within a single memory cell are typically limited to storing a number of levels corresponding to an even power of two.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY OF THE INVENTION

These and other limitations are overcome by embodiments of the invention which relate to systems and methods for storing and retrieving data using flash memory devices. One example embodiment includes an apparatus within a flash memory configuration. The flash memory configuration includes a plurality of memory cells, where each memory cell has a charge storage capacity for use in implementing digital storage. The apparatus includes a processing arrangement configured to access each of the memory cells in a write operation and a read operation. The apparatus also includes an instruction set for instructing the processor to impose target charge levels for defining a plurality of data values for each of the memory cells. The target charge levels are programmably movable with respect to the charge storage capacity, and in one embodiment, the number of distinct data values defined by the target charge levels is a non-integer power of two.

Variations on this general approach are also illustrated. For example, in another embodiment, the instruction set may establish a charge tier structure that is made up of a plurality of charge tiers that are characterized by a progressively increasing amount of charge across the charge storage capacity. Each charge tier is associated with storage value and a charge value defining a charge amount. The chare values making up the charge tier structure may be programmably moved by the processor.

The present invention further relates to memory devices configured to perform error correction and compensation. For instance, and in one embodiment of the invention, a flash memory configuration that is capable of using a cell array device, where the cell array device is associated with a performance characteristic that can vary between different cell array devices. The flash memory configuration includes an apparatus having a control arrangement configured to access the cell array device to establish a value of the performance characteristic for the cell array device. The control arrangement is further configured to subsequently access the cell array device and apply compensation based on the value of the performance characteristic. The compensation may be used, for example, where the memory cells include a range of target charge levels for defining a plurality of data values, as described above. When performing read and write operations, the control arrangement may be configured to establish corrected target charge levels based in part on the value of the performance characteristic.

Other embodiments of the invention provide for methods and systems for determining performance characteristics to be used when performing error detection and correction. For example, in one embodiment, a flash memory configuration includes a plurality of memory cells, where each memory cell having a charge storage capacity for use in implementing digital storage. Each memory cell includes target charge levels for defining a plurality of data values that can be stored therein. A method is disclosed for generating compensation data to be used during at least one of a read from the memory cells and a write to the memory cells. The method includes identifying a predetermined information pattern consisting of pattern code data used to calibrate the memory cells. The pattern code data is converted into memory symbols, where each of the memory symbols identifies one of the target charge levels. The memory symbols are written to a known location within the memory cells by applying the target charge levels identified by the memory symbols to the memory cells.

To calibrate the memory cells, one embodiment of the invention reads memory symbols from the known location within the memory by sensing charge levels stored within the memory cells at the known location. The memory symbols are converted into comparison code data, and the comparison code data is compared against the original pattern code data that was written to the known location. The comparison is used to determine a difference value, which may be used for calculating a performance characteristic. The performance characteristic can be used during subsequent reads and writes to the memory cells when performing error detection and correction.

This Summary is provided to introduce a selection of concepts in a simplified form that are further described below in the Detailed Description. This Summary is not intended to identify key features or essential characteristics of the claimed subject matter, nor is it intended to be used as an aid in determining the scope of the claimed subject matter.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 6a and 6b illustrate an example memory symbol encoder and an example memory symbol decoder, respectively;

DETAILED DESCRIPTION

In the following detailed description of the preferred embodiments, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

System

Figure 1:
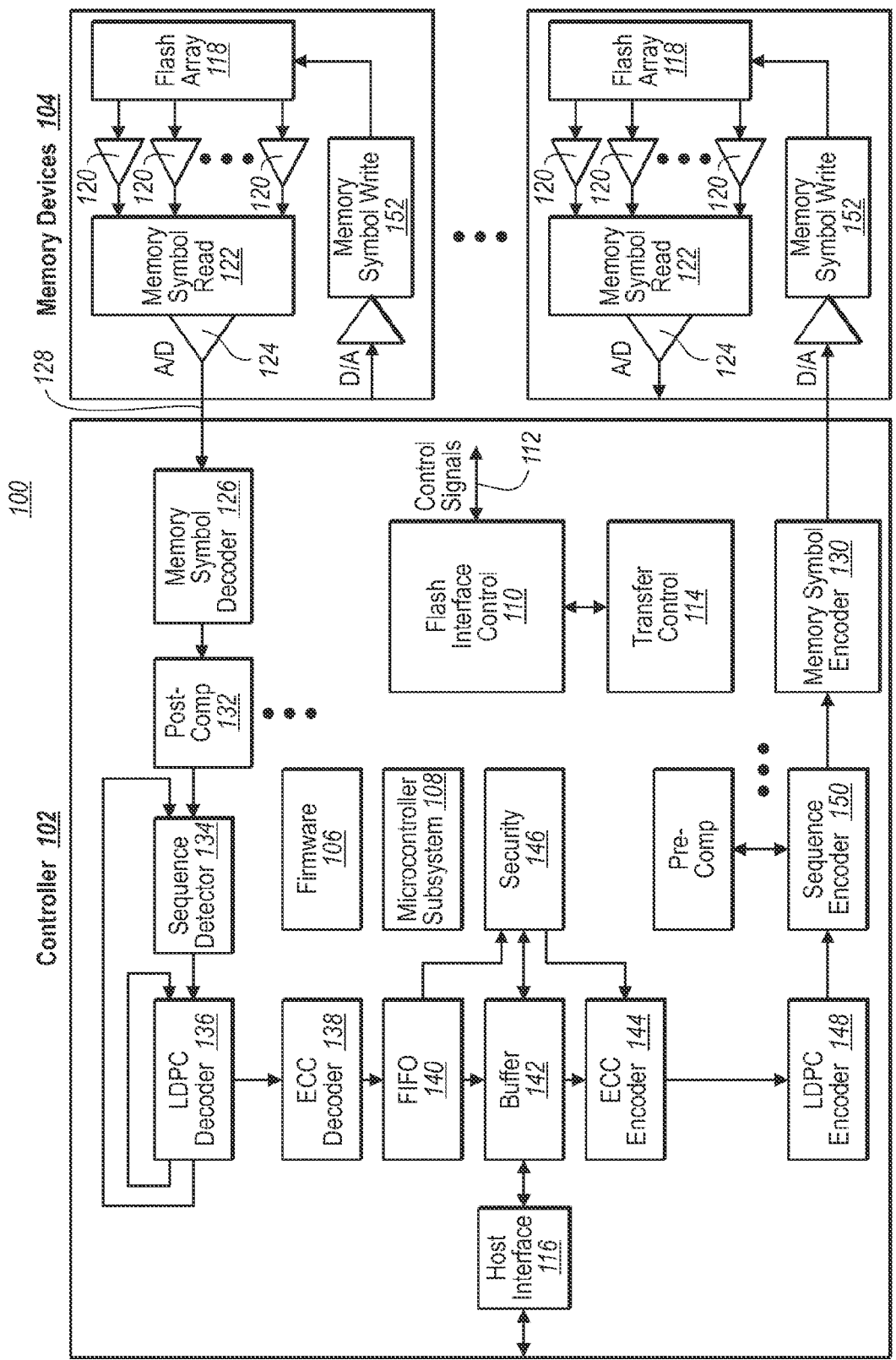
FIG. 1 illustrates an example solid state storage element including a controller and memory devices.

Attention is now directed to FIG. 1, which is a block diagram of one example embodiment of a system, denoted generally at 100, and its various components. This system 100 may be referred to herein as a Solid State Storage Element, SSSE or S3E. The sections in FIG. 1 show data path and control components that are the basis of functionality for purposes of programming (i.e., writing) and reading data. An overall system is illustrated which includes a controller 102 and at least one memory device 104. In a system having a plurality of memory devices 104, each memory device can be a separate device to constitute a portion of the storage media for the system. In one example, each memory device 104 can be formed on an individual semiconductor die. In contrast, more than one memory device 104 can be formed on a single semiconductor die.

As will be seen, a Solid State Storage Element 100 can be made up of a plurality of integrated circuit devices (hardware) that include data storage media, host connectivity, and methods for data storage, data retrieval, and various management functions required for optimal use of the storage media. In one embodiment, component integrated circuits can be a plurality of Solid State Storage Element memory devices (S3E memory devices) 104 and a single Solid State Storage Element Controller Device (S3E Controller Device). One suitable technology for the storage media is NAND flash. However, other non-volatile storage technologies are equally applicable. Examples of alternative storage media are MRAM (Magnetic Random Access Memory), PRAM (Phase Change Random Access Memory), and storage media based on MEMS (Micro Electro-Mechanical) based media. Other suitable storage media technologies may be identified, either currently existing or yet to be developed. What is common to memory cells that use these various technologies resides in a capability of the memory cell to store information in an analog form. That is, these devices are not generally reasonably characterized as on/off or digital devices. Thus, the use of charge levels in the context of this disclosure is considered as exemplary in nature.

The system 100 may include a microcontroller 102 with attached memories for microcode (firmware) 106 and variable storage. It also includes addressing logic, which enables firmware 106 running on the microcontroller 102 to communicate with and control operations of controller 102 logic sections. Microcode is stored on a non-volatile storage medium. In the present example, the microcode is stored in non-volatile memory in the controller, however, non-volatile storage for purposes of storing such microcode can be external to both the controller 102 and the plurality of memory devices, or it may be in one or more of the memory devices.

Firmware 106 is the set of microcontroller instructions (i.e., microcode) that coordinate and control all activities performed by the controller 102. All of the controller 102 sections have interfaces to the microcontroller subsystem 108 which are used by the firmware 106 to control each section's hardware in the context of executing read flows, write flows, calibration, as well as all other functions required in implementations. These individual interfaces have not been shown for purposes of illustrative clarity and can implement communication with the various sections, as will be appreciated by one of ordinary skill in the art.

The flash interface control 110 generates control logic and signals 112 which make up the non-data portion of the interface between the controller 102 and the plurality of memory devices 104. The signals 112 from this section implement physical control lines on the interface or interfaces with the memory devices 104, for example, including chip selects, clocks, operation codes, address information, and any other specific signals required in a given implementation for purposes of operating the memory device interface. In producing the control logic and signals, the flash interface control 110 cooperates with a transfer control 114, as will be described immediately hereinafter.

The transfer control 114 provides the functionality needed to coordinate read flows and write flows with the plurality of memory devices 104. One or more instantiations of the transfer control 114 can be implemented in actual designs. A plurality of transfer controls 114 makes possible concurrent operation of read flows, write flows, or a combination of read flows and write flows with more than one of the plurality of memory devices 104. Each transfer control 114 is controlled by the microcontroller subsystem interface 118 and firmware 106, and operates in conjunction with the flash interface control 110. A transfer control 114 connects to a flash interface control 110 and requests the flash interface control's services. The combined function of one transfer control 114 and a flash interface control 110 is to conduct block-by-block transfer of data blocks between memory devices 104, and the controller 102 itself. Additional instances of transfer controls 114 have not been shown for purposes of illustrative clarity, however, additional instances may function similar to the operation of a single instance.

Read Process Operation

The following section describes block-by-block processing that is executed by the controller 102 during a read process. In one implementation, transfers between a host and the memory devices 104 can occur as a sequence of single-block transfers. It is noted that the host is not shown for purposes of illustrative clarity, but is connected to a host interface 116.

In the illustrated embodiment, each of the plurality of memory devices 104 contains a flash array 118. Each flash array 118 contains a plurality of storage cells, which may be referred to individually herein as a memory cell. In Flash memory, each memory cell is generally an FET (Field Effect Transistor) with a charge storing gate structure.

In the example embodiment, each of the memory devices 104 also includes one or more sense amps 120 for providing the interface between the memory symbol read module 122 (described below) and the flash array 118 (described above). Most implementations can feature a plurality of sense amps 120 and the number and arrangement of sense amps 120 is a dependant on the memory device implementation. The function of a sense amp 120 is to sample the state of one memory cell in the flash array 118, and to present a representation of the sensed state to the respective input of the respective memory symbol read module 122.

Each memory device 104 has a memory symbol read module 122 that detects information stored in the flash array 118 and transmits memory symbols representing the stored information to the controller 102. In the illustrated embodiment, an analog-to-digital (A/D) converter 124 can form part of the memory symbol read module 122 such that the memory symbols are transferred to the controller 102 in digital form. In another embodiment, the memory symbol read module 122 and associated A/D 124 can be located in the controller 102 such that analog lines can run from the sense amps 120 to the controller 102. It is noted that a memory symbol is a construct having a value that can correspond to one of a set of values or levels that has been chosen for the memory medium at hand. The set of values or levels may be referred to as an "alphabet".

One or more sets of memory symbols may be included in a given controller 102 embodiment, as will be further described. The controller 102 receives memory symbols from the interface 128 connected with one or more memory devices 104, and decodes these symbols into code symbols. Each code symbol can be considered as one unit of a code symbol alphabet. A string of code symbols represents encoded information that has been imparted with properties that are used in the decoding process. The decoding process may be the inverse of that described below with respect to the memory symbol encoder 130. A series of digits with radix k may be converted into a series of code symbols. When leaving the memory symbol decoder 126, the code symbols can be represented in any suitable manner such as, for example, by a binary bit stream or a stream of binary-based digits such as bytes. It should be appreciated that the memory symbol decoder 126 implements a mapping from memory symbols to code symbols. Memory symbols can represent a non-integer power of two, based on the number of discrimination levels that are defined for a memory cell. Of course, the write operation may implement a reverse of this mapping from code symbols to memory symbols, as will be detailed below. The storage system 100 may have a definable or selectable radix, and the radix may not be required to be an integer power of two.

Code symbols from the memory symbol decoder 126 can optionally be adjusted according to information developed by a calibration step that is performed by the controller 102 upon the plurality of memory devices 104 attached to the controller 102/memory device interface. With respect to the error correction schemes described herein, it should be appreciated that these schemes can be used individually or in any desired combination. Moreover, additional schemes may be identified that are equally applicable and could, at least potentially, be adapted, for example, from the communication theory arts or the disk drive arts. In this regard, it submitted that the state-of-the-art with respect to non-volatile flash memory resides in enforcing a high degree of accuracy with respect to read and write operations such that there is no need for the sorts of error correction that have been brought to light herein. The present disclosure, however, sweeps aside the need for enforcing such a high degree of absolute read/write accuracy in a way that provides substantial benefits including, but not limited to the capability to store an increased amount of information in an individual memory cell.

Further details of the calibration step will be provided at one or more appropriate points below. In this regard, FIGS. 4 and 5, described below, represent one embodiment of the write and read flows, respectively, by which the calibration process can obtain parametric data about the behavior of selected memory devices 104 which can be used by a post compensation module 132. Calibration information developed during the calibration flows can subsequently be applied to the received code symbol stream that flows from the memory symbol decoder 126. In one embodiment, post compensation 132 symbol adjustments can be performed over an entire symbol block. The adjustment to each symbol may be a combination of unique per-symbol adjustments as well as adjustment values that are constant, or that vary in a predictable way, across the entire symbol block. The manner in which post compensation 132 symbol adjustments are determined may vary and be customized according to the particular characteristics of the memory technology underlying each memory device 104 attached to the controller 102. Moreover, the post compensation 132 adjustments can even be customized on a per device basis.

The illustrated embodiment further includes a sequence detector 134 for receiving a stream of code symbols from the post compensation module 132 or from the memory symbol decoder 126 and for converting the code symbols to data symbols. Code symbols can pass through the sequence detector 134 one block at a time, which means that input code symbol streams have a known length which is a direct function of the data block size and the rate of the code. The sequence detector 134 may implement an iterative decoding algorithm; hence, a given data block may be passed through the sequence detector 134 more than once, as will be further described. The data symbols produced by the sequence detector 134 are user data symbols, but these symbols can be considered as "dirty" from the standpoint that only partial error correction processes have been performed on them up to this point.

With respect to the implementation of a sequential correlation scheme, in general, the contents of any given memory cell will be interpreted based on the contents of at least one other memory cell. Accordingly, during a read operation, an error probability can be associated with a value that is read as corresponding to a particular one of a set of legal data values. Any suitable scheme may be employed for purposes of imposing sequential correlation. Currently available schemes include, for example, the a Viterbi detector, and detectors described in H. Thapar and A. Patel, "A Class of Partial Response Systems for Increasing Storage Density in Magnetic Recording"—*IEEE Trans. Magnetics*, vol. 23, 5, pp. 3666-3668 1987, which is incorporated herein by reference. Further description will be provided at one or more appropriate points below.

The example system 100 further includes an LDPC (Low Density Parity Check) decoder 136 for providing error correcting on user data encoded previously with parity information. Examples of LDPC can be found in the following references, which are incorporated herein by reference: Gallagher, "Low-Density Parity-Check Codes" M.I.T. Press, 1963; David J. C. MacKay, "Information Theory, Inference, and Learning Algorithms", Cambridge University Press, 2003. The LDPC encoding may be performed during the write process, which will be described in further detail below. The LDPC decoder 136 is an iterative decoder, such that each block of information processed by the decoder may be processed repeatedly up to a number of iterations defined as the maximum for the embodiment. Input data is user data in the form of code symbols that include LDPC parity. The output is user data symbols only. Output user data symbols have been "cleaned" by the LDPC decoding process so that their error content is smaller than that of the input code symbols.

During the write process, the LDPC encoding process includes the calculation of parity on a received block of information (e.g., data bits) using a mathematical construct that may be referred to as a parity check matrix. Because LDPC arrangements involve binary information, each block of user data that is to be encoded is treated as a series of binary bits. Application of the parity check matrix to the calculation of LDPC parity reduces to the solution of a set of logic equations using selected bits in the data message as terms for each parity bit that must be calculated. After all parity bits required by the arrangement of the parity check matrix have been calculated, they may be appended to the user data block which was the input to the encoding process.

During the read process, the combined user data and LDPC parity can be received from the sequence detector 134. In one embodiment, the sequence detector 134 may identify and repair errors on received data that result from noise and distortion, however, it is expected that there may still be remaining errors in the user data plus LDPC parity that is returned from the sequence detector 134. The LDPC decoder 136 acts upon the received user data plus LDPC parity so as to correct additional errors. The decoding operation is similar to the inverse of the encoding process, and involves estimation of data bit values based on reverse calculation of logic equations using both data bits and LDPC parity bits as terms. Because the operation involves probabilities, the outcome of each calculation is governed by the set of possible outcomes for each calculation, thus the decoding process is one of carrying probabilities from one calculation to the next. Because of this, the decoding process is inherently iterative, and so the LDPC decoder implementation can perform multiple passes at discovering and correcting errors in blocks of received user data plus LDPC parity.

The illustrated system 100 also includes an ECC (Error Correction Code) decoder 138, which may be the final step in one example decoding process. Input to the ECC decoder 138 may include a user data symbol stream including a block of information that has ECC parity symbols appended. Details with respect to an ECC encoder 144 will be provided at one or more appropriate points below, in conjunction with a description of the write process. The output is "clean" data to the extent that successful decoding results in error-free data. If an error free condition cannot be achieved by the ECC decoder 138, an error condition is signaled so that an appropriate error handling process can be undertaken. With respect to the implementation of an ECC error detection scheme in the present application, it is considered that one of ordinary skill in the art is capable providing such functionality with respect to ECC and LDPC decoding and encoding sections, as referred to herein, with the benefit of the present disclosure.

The example system 100 further includes a FIFO (First In First Out] module 140, which includes a data staging memory that is used in cooperation with the ECC decoder 138 to hold user data symbols coming from the LDPC decoder 136 during the ECC decoding process. After the LDPC decoder 136 is finished processing a data block, that data block is transferred to the FIFO 140. The FIFO 140 acts as a holding area for the data while the ECC decoder 138 is processing it. The ECC decoder 138 is responsible for releasing each data block in the FIFO 140 for transfer to the buffer 142. When the ECC decoding process identifies errors in user data as part of a user data block transferred from the LDPC Decoder, correction is applied to the FIFO 140. Each block of user data is transferred from the FIFO 140 to a buffer 142 after the ECC decoding process on the block is complete.

The illustrated system 100 also includes a security module 146 that may include one or more functions that ensure data security. In the read process, its purpose is to decrypt data that is being read from the memory devices 104. When the security module 146 is disabled or not present, read data flow is from the FIFO 140 directly to the buffer 142. If the security function is enabled, data flow is from the FIFO 140 to the security module 146, then from the security module 146 to the buffer 142, which is described immediately hereinafter. When the security module 146 is enabled, input data to the security module is encrypted user data, and output is decrypted user data. Any suitable decryption process may be used, either currently available or yet to be developed including, but not limited to AES (Advanced Encryption Standard). It should be appreciated that other suitable functions may be implemented at this point. For example, there can be support functions that authenticate users, generate keys, protect keys, exchange keys with other entities, and the like.

The memory buffer 142 serves as a staging area for user data blocks passing to or from the host (not shown). The buffer 142 operates as a speed matching and synchronizing mechanism for transfers between the host and the controller 102 and for write and read processes ongoing with the plurality of memory devices 104. One having ordinary skill in the art will readily provide such functionality in view of this overall disclosure.

User data is transferred from the buffer 142 to the host interface 116 prior to be sent to the host. Suitable embodiments include at least one interface that conforms to specifications and standards for generally accepted host interfaces. Examples of host interfaces that may be used include ATA, USB, Serial ATA (SATA), Secure Digital (SD), Compact Flash (CF), and the like.

Write Process Operation

The following section describes block-by-block processing that is executed by the controller 102 during a write transfer. Write data originates in the buffer 142 (having been written into the buffer 142 as the result of a transfer from the host to the buffer via the host interface 116), and finishes by a programming step in which encoded data is written into cells of one or more memory devices 104.

The memory buffer 142, described in some detail above, serves likewise in the context of a write process as a staging area for user data blocks passed from the host. In this case, the buffer 142 is the source of user data to be processed, and ultimately written into the memory devices 104 as the result of the controller write process.

As described above with respect to a read operation, a security module 146 includes a set of functions used to ensure data security. Its use may be optional and, in this regard, may depend upon the application of the particular product in which the example system 100 of FIG. 1 is deployed and the context under which the write operation is being executed. If the security module 146 is disabled or entirely absent, write data flow is from the buffer 142 directly to an ECC encoder 144. On the other hand, if the security module 146 is enabled, data flows from the buffer 142 to the security module 146. The input data to the security module 146 may include a block of unencrypted user data, and the data output by the security module may include a block of encrypted user data. Any suitable encryption process, either currently available or yet to be developed, may be used in cooperation with the decryption process including, but not limited to the Advanced Encryption Standard (AES).

In one embodiment, the ECC encoder 144 executes the first encoding step. Data transferred from the buffer 142 is user data and the ECC encoder 144 may append a set of parity symbols that are determined based on a user data block. Output from the ECC encoder 144 may include a block of user data symbols plus a set of ECC parity symbols. In the overall write flow, the ECC parity symbols generated by the ECC encoder 144 are regarded by subsequent steps as part of user data. In this context, the concatenation of user data symbols and ECC parity symbols for any given data block is regarded by the LDPC encoder 148 (described below) and the sequence encoder 150, as a single user data symbol stream. Stated in a slightly different way, the ECC parity symbols, in this embodiment, are treated by downstream components in a manner that is identical to the treatment of the user data itself.

In one embodiment, the LDPC encoder 148, may receive ECC-encoded user data as a block of user symbols with a set of ECC parity symbols. The LDPC encoder 148 may calculate and append LDPC parity to the block of user data symbols plus ECC parity symbols received from the ECC encoder 144, assuming that the ECC encoder is in use. Output from the LDPC encoder 148 is the received set of data symbols (user data plus ECC parity) with a set of LDPC symbols appended. LDPC encoding may be performed in a single pass, so in contrast to the decoding process and in one embodiment, LDPC encoding does not entail the possibility of multiple iterations.

The encoding process of the LDPC encoder 148 may include the calculation of parity on a received block of information (data bits) using a mathematical construct referred to as the parity check matrix. Because LDPC arrangements involve binary information, each block of user data that is to be encoded may be treated as a series of binary bits. Application of the parity check matrix to the calculation of LDPC parity reduces to the solution of a set of logic equations using selected bits in the data message as terms for each parity bit that must be calculated. After all parity bits required by the arrangement of the parity check matrix have been calculated, they are appended to the user data block which was the input to the encoding process. The resulting combination of user data bits plus LDPC parity bits is the output from the LDPC encoder 148.

In one embodiment, the ECC/LDPC-encoded user data from the ECC encoder 144 and the LDPC encoder 148 is transformed to a series of code symbols by the sequence encoder 150. When employed, the sequence encoder 150 maps the input data symbols into a set of code symbols that has been imparted with sequential correlation. This gives the encoded data the property that the value of each symbol is dependent in a limited, but defined way on at least one other symbol. Therefore, upon read-back, the decoding process will be able to separate some proportion of noise and errors that might be acquired during the write and read processes with the memory devices 104 as an additional layer of correction over and above the ECC/LDPC correction schemes. Additional details are provided below in conjunction with a description of FIG. 8.

In one embodiment, the code symbols output from the sequence encoder 150 (which comprise encoded user data plus ECC parity plus LDPC parity) are converted into a stream of memory symbols by a memory symbol encoder 130. Memory symbols are members of a set of possible symbols that may be applied to a particular configuration of a particular memory device 104. A wide variety of sets of symbols can be realized. In one embodiment, storage cells in the memory devices 104 are configured to store one of a finite number of levels.

In conventional systems, such memory cells are configured to store a limited number of levels corresponding to an even power of 2. In one embodiment of the present invention, the memory cells are configured to store an arbitrary number of levels, which may or may not represent an integer power of 2. For example, if some of the cells in a particular memory device 104 are configured to store seven distinct levels (comprising seven distinct target levels which may be sensed), each memory cell in the configuration can store numeric digits with a radix of seven. Hence, there are seven possible memory symbols in this configuration, each corresponding with one of the seven possible target levels of the configuration. It should be appreciated that, in order to distinguish these levels from one another, six discrimination boundaries may be imposed on the range of charge that is available in a given memory cell. It should be appreciated that the access resolution of the hardware that establishes and reads the charge in the memory cells establishes a maximum radix for each cell. Depending upon the access resolution, the number of target levels can essentially increase without bound, as will be further described.

The function of the memory symbol encoder 130 is to convert a series of code symbols into a series of memory symbols in a manner that is consistent with the number of discrimination levels defined for the memory device 104 and memory cell configuration. The process becomes one of converting a stream of input symbols, comprising either binary bits, or binary based symbols such as bytes, into a stream of digits having radix=k, where k is the number of target levels supported in the current memory device configuration. It is noted that the value of k may vary within a system implementation, thus one property of the memory symbol encoder 130 may be its capability to generate memory symbols according to a given value of k. It should be appreciated that k may vary from one memory device 104 to the next within a given system embodiment. Further, k may vary as applied to the memory array of an individual memory device 140. For example, different regions of the memory array may be assigned different values of k.

The conversion of code symbols to memory symbols and from memory symbols back to code symbols is a function of the number of target levels. The unit being stored in a memory cell is effectively a single-digit number whose radix is the number of target levels for which the applicable memory cell is configured.

In the illustrated system 100, each memory device 104 includes a memory symbol write module 152 for receiving the stream of memory symbols from the memory symbol encoder 130 and programs or writes their values into the flash array 118. Like the memory symbol read module 122 described previously, the memory symbol write module 152 can also be moved into the controller 102 or may be functionally distributed in some suitable manner between the controller 102 and the memory symbol write module 152.

Figure 2:
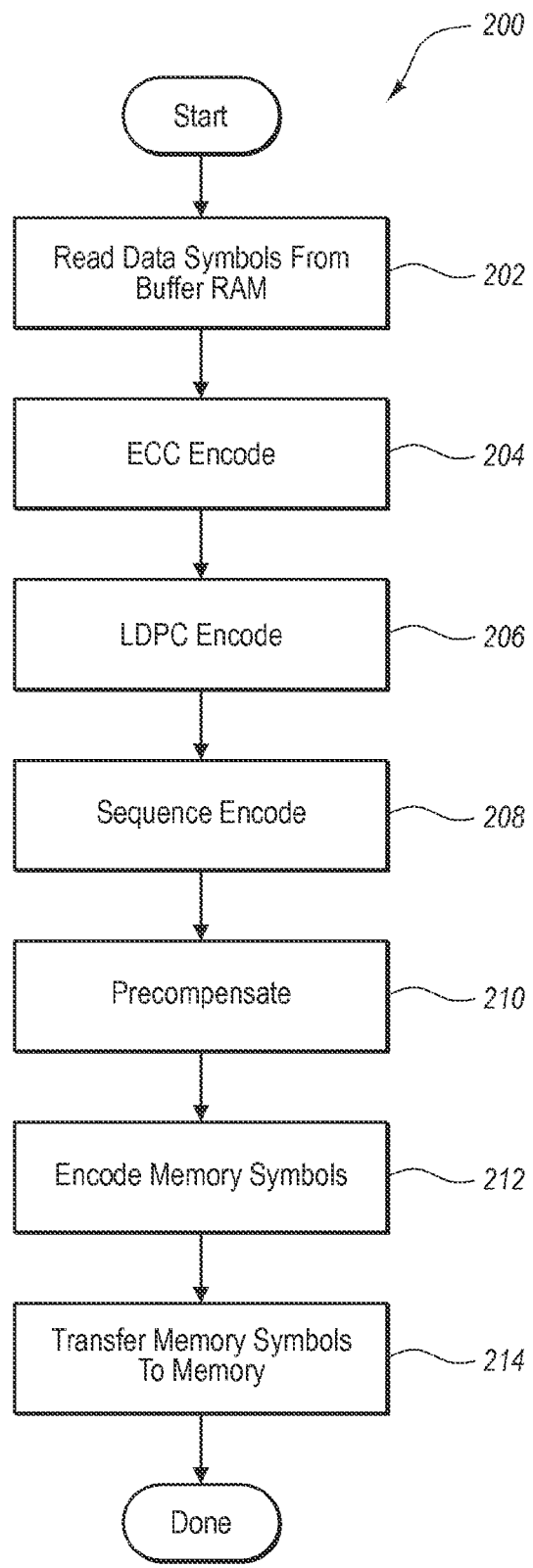
FIG. 2 illustrates one example of a method of writing data to a storage media.

FIG. 2 illustrates one embodiment of a method 200 of writing data to the storage media. In the present example, the minimum amount of data transferred as a result of the method 200 is one block, where the length of a block can be 512 bytes, but can also be 512 bytes multiplied by an integer power of 2. Hence, steps in the flow represent processing steps performed on block-length units. It should be appreciated that other block sizes can be used and that there is no absolute need to transfer data in block form.

Whereas the system diagram of FIG. 1 shows a security function integrated with the controller 102, the example method represented in FIG. 2 is a simplification with respect to the fact that the security function is omitted for purposes of descriptive clarity. However, such a security module 146 is readily incorporated in view of FIG. 1. The following description otherwise relates to the sections as shown and should, therefore, be interpreted in conjunction with FIG. 1.

Referring to FIG. 2, in conjunction with FIG. 1, the write process begins at the "start" point and is complete at the "end" point. At the "start" point, a user data block has been placed in the buffer 142 as the result of one step in a write command by which user data associated with the write command is transferred from the host interface 116 to the buffer 142 issued by the host. The specific embodiment of the host interface 116 determines details of this process, which is considered to be beyond the scope of the present disclosure, and is well-understood by those having ordinary skill in the art. It is noted that the various steps involving data transfers can be performed as needed by the microcontroller subsystem 108.

The method 200, beginning at step 202, includes reading data symbols from buffer RAM. In one embodiment, reading the data symbols may include transferring a block of user data symbols (bytes) from the buffer 142 to the ECC encoder 144.

The method 200 further includes, at step 204, reading the user data symbols from the buffer 142 and processing and appending the user data symbols with a set of additional data symbols that comprise ECC parity. The result from performing ECC Encoding is a block of user data symbols plus the set of ECC parity symbols. Hence, the number of output symbols may exceed the number of input symbols by the number of ECC parity symbols.

The set of user data plus ECC parity symbols generated by the ECC encode step 204 are encoded using an LDPC encoding scheme, as denoted at step 206. LDPC calculations are generally in terms of the input being a stream of bits rather than a stream symbols, but symbols may be treated as sets of bits. The LDPC encode step 206 may calculate parity on the entire set of the user data block symbols plus ECC parity symbols. The result of the calculation is an additional set of LDPC parity bits that is represented in the data flow as a set of additional symbols. Hence, the output of this step is a block of user data symbols appended with a set of ECC parity symbols, which in turn is appended with a set of LDPC parity symbols.

The method 200 further includes, at step 208, sequence encoding the stream of symbols output from the LDPC encode step 206 is in its entirety, treated as a stream of data symbols that are to be encoded into code symbols. Accordingly, the input stream is encoded into a stream of code symbols wherein the encoding process imparts sequential correlation. This stream of code symbols is a representation of the original user data, which will be stored in the memory devices 104.

The code symbols generated by the sequence encode step 208 can be observed and adjusted according to various performance characteristics during a pre-compensation step, denoted at 210. For example, the performance characteristics can be properties and behaviors that apply to all data being written to the media in a predictable way such as, for example, resistance effects accruing in storage memory cell values as a function of the offset of a physical cell with respect to the sense amp 120. Alternatively, the performance characteristics can be properties and behaviors that apply to pattern-sensitive effects that have to do with "nearest neighbor" effects in flash memory.

In the example method, the procedure that is applied during the pre-compensation step 210 may be invariant across all media for a particular type of memory device 104 that is in use. This procedure can include a specific set of rules and a protocol for their use. In another embodiment, the pre-compensation rules applied at step 210 may be variable from one memory device 104 to the next device, even in the instance of using memory devices 104 that would presumably be identical. In this latter case, a customized pre-compensation can be applied for each memory device 104.

In one embodiment, step 210 includes customized pre-compensation that presumes a prior calibration process (possibly during manufacturing) by which, for example, the controller 102 gathers relevant information about the storage media to which it is attached. This can entail, by way of non-limiting example, writing a known pattern to the memory, reading the pattern back and analyzing the return against the known input and, thereafter, extracting relevant information about the differences. In one embodiment, the pre-compensation function calculates and applies correction values to the code symbols in a way that anticipates the physical and logical arrangement of the data in the memory. In this way, a wide variety of repeatable error producing distortion mechanisms can be subjected to pre-compensation with no need to develop a detailed understanding of the principles that underlie the specific reasons for which errors may be produced with respect to each mechanism. A detailed understanding of a given mechanism can provide for additional process inputs to still further reduce the probability of error that may be encountered during readback of such pre-compensated data.

Through establishing one or more performance characteristics, a predicted response of a given memory cell is established that is based on the performance characteristic. During the actual write operation, a single dose of charge can be delivered to the given memory cell by adjusting a charge delivery parameter that relates to establishing a target charge value in the given memory cell, based on the predicted response, such that an actual charge value is produced in the given memory cell by the single dose of charge, which actual charge value is equal to the target charge value, at least to an approximation. The charge delivery parameter, by way of non-limiting example, can be a time interval duration, a current value or a voltage value. Conversely, in conventional system, a step-by-step process is generally used whereby the amount of charge in the cell is checked and re-checked as it incrementally approaches a target value. While this may be effective in establishing the correct amount of charge in the memory cell, this technique is inherently slow and thereby introduces constraints on data throughput.

The method 200 further includes, at 212, encoding the memory symbols. In one embodiment, encoding the memory symbols includes receiving as input the code symbols generated by the sequence encode step 208, either with or without pre-compensation applied at step 210. The input is transformed into a stream of symbols that can be directly represented in a set of memory cells. In one example embodiment of the system using NAND flash, based on NROM technology, this process, in one exemplary embodiment may treat the code symbol stream as a corresponding stream of bits, and parse the bit stream into units that can be represented by a stream of discrete voltage levels which can subsequently be applied to memory cells, as will be further described. Since, as described previously, the number of levels in a memory cell can be a non-integer power of 2, this process can be at least somewhat more complex than simply dividing the entire bit stream into a sequence of smaller multi-bit units—it needs to, in effect, divide the input bit stream into a set of smaller multi-bit units along fractional bit boundaries such that all the information can be mapped onto the memory in a suitably efficient manner.

The method 200 also includes, at step 214, transferring memory symbols to the memory. In one embodiment, transferring the memory symbols to memory may include transferring the memory symbols calculated at step 212 to the memory that is resident on a selected memory device. The process may include presenting of one symbol at a time to the selected memory device via the interface between the controller 102 and the memory devices 104. The selected memory device 104, in turn, accumulates the information symbols into a staging area. Once a sufficient quantity of memory symbols have been accumulated in the memory symbol write module 152 of a memory device 104, they are applied to the memory in a manner consistent with the technology and the embodiment of the memory device itself.

Thus, specific details are well understood and are considered to be beyond the scope of the present disclosure.

Figure 3:
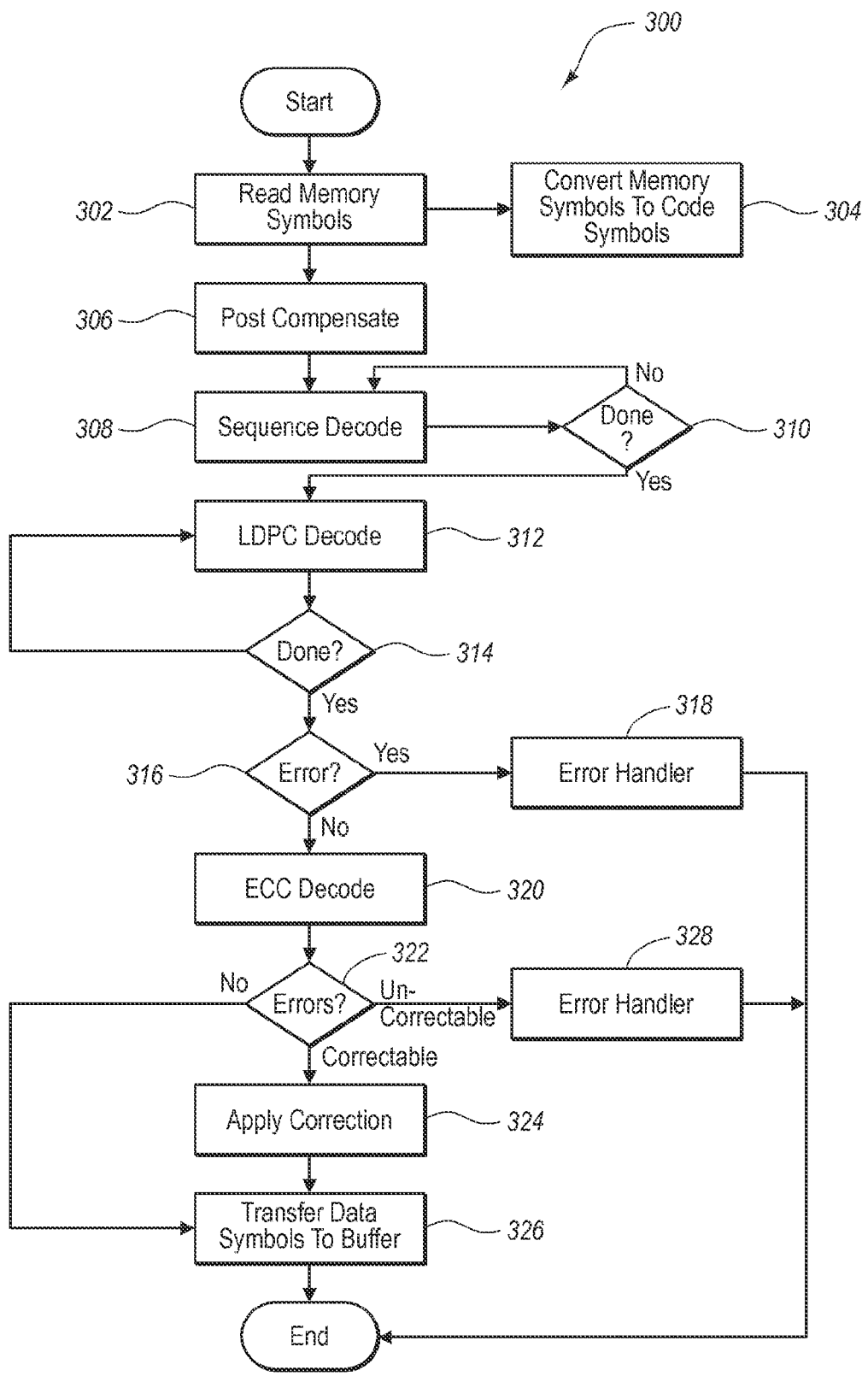
FIG. 3 illustrates one example of a method for reading data from a storage media.

Referring now to FIG. 3, an example method, denoted at 300, is illustrated. Generally, method 300 shows an example of the steps that can be used for reading data from the storage media. In the example method 300, the minimum amount of data transferred is one block, where the length of a block can be 512 bytes, but can also be 512 bytes multiplied by an integer power of 2. Hence, steps in the flow represent processing steps performed on block-length units. The method 300 corresponds to the steps taken to read a single block of user data from the memory device and to place it in the buffer 142 where it can be transferred to the host via the host interface 116. Reading n blocks entails n passes through this flow diagram.

Whereas the system 100 illustrated in FIG. 1 shows a security module 146 integrated with the controller 102, the flow represented in FIG. 3 is a simplification with respect to the fact that the security module is not shown for purposes of descriptive clarity, however, it is readily incorporated in view of FIG. 1. The following description otherwise relates to the sections as shown and taken in conjunction with FIG. 1.

The method 300, beginning at step 302, reads the memory symbols from the storage media in accordance with a number of parameters. For example, the number of symbols read can be determined by the size of the user data block, the amount of overhead added by the other encoding levels, and the size of the memory symbol alphabet. Some of these parameters can vary as a function of the embodiment, but also can vary dynamically within an embodiment. In this regard, the memory symbol decoder 126, in one embodiment, may be configured to operate with more than one code symbol alphabet, where the configuration itself may be determined and selected by firmware 106. For example, one configuration can operate with a radix 7 alphabet, while another configuration can operate with a radix 9 alphabet, and so on. The number of possible configurations is a design feature that implements the memory symbol encoder 130 and memory symbol decoder 126.

The method 300 converts the memory symbols to code symbols, as denoted at 304. In one embodiment, converting the memory symbols to code symbols can entail an analog to digital conversion of the level read from each memory cell. In one embodiment, the conversion to digital form can take place in the memory device, such that the lines from the memory device to the controller 102 are in a digital format. In another embodiment, the digital conversion can take place in the controller 102, such that the lines extending from the memory device 104 to the controller 102 are analog lines that essentially carry signals from the sense amps 120.

The example method 300 includes post compensation step 306, which is analogous to the pre-compensate step 210 in the write process illustrated in FIG. 2. In the event that the post compensation step 306 is employed, a distortion mechanism can be accommodated by post processing, for example, if it is not feasible or efficient to perform a pre-compensation step. The basis of correction values or protocols is also analogous to the pre-compensation described previously. For example, known invariant effects or information gathered from a prior calibration process may be used during the post compensation step 306.

The example method 300 further includes, at step 308, sequence decoding a stream of post-compensated code symbols, as a result of post compensation step 306, or alternatively emanating directly from the step 304 where post compensation is not used. It is noted that this step 308 is not required to decode sequences, and may directly decode the data stream in an embodiment that does not employ sequential correlation. In one embodiment, the sequence decode step 308 converts the code symbol stream to a data symbol stream (which may be corrupted by noise and distortion effects from the memory write/read processes). In one embodiment, the sequence decode step 308 is iterative, i.e., one or more processing steps can be repeated as needed to obtain the stream of data symbols from the stream of code symbols. The method 300 allows for this possibility by showing an iteration loop 310 over the sequence decode step 308. The iteration criteria can be dependent on the sequential coding method that is implemented in a particular embodiment. If, for example, the sequence decode process is a single iteration type of process, then the "done" criteria 310 are always true.

The data symbols from the sequence decode step 308 are received and are decoded using an LDPC decoding scheme, as denoted at step 312. The input may include the "dirty" user data symbols (one block), a set of ECC parity symbols, and a set of symbols representing the LDPC parity. By the term "dirty", it is meant that the information that is the current subject of processing may contain errors that are correctable by the correction mechanism that is currently being invoked. Conversely, clean data is no longer correctable by the currently invoked correction mechanism, at least from a practical standpoint.

The LDPC step 312 uses the LDPC parity, treated as a set of parity bits, along with a decoding process, to find and correct errors in the "dirty" data. The process may be iterative, as illustrated by the iteration loop 314, and the decision at each iteration to undertake another pass can be based on any of several criteria. For example, the criteria may be based, at least in part, on an indirect measure of the number of errors remaining in the data being processed. In the event that data becomes clean after some processing activity, a check can be made to verify this. In some rare cases, deadlocks of various kinds can occur that stall the cleaning process and, for these, a maximum iteration count may be applied to cause the process to abort, in which case an error handling step is the next step in the flow.

The illustrated method 300 further includes, at step 320, performing ECC decoding on an input that may include a set of user data bits and a set of ECC parity bits. Where LDPC decoding has been performed at step 312, the LDPC parity symbols are not part of the symbols stream and so the only information arriving at the ECC Decoder is the user data itself (still dirty) and the ECC parity bits. The ECC decoding step 320 serves, at least potentially, to correct any final errors not caught by the LDPC decode step 312.

The ECC decode step 320 can result in one of three outcomes at decision 322. First, correctable errors are detected, meaning that the method 300 proceeds to correct the errors, as denoted at 324. In one embodiment, applying correction includes calculating the ECC error vectors, and applying the vectors to the input data symbols in a manner that will be familiar to one of ordinary skill in the art in the field of ECC. After error correction is performed, the method 300 proceeds to the point where data symbols are transferred to the buffer, as denoted at step 326.

Second, the ECC decode step 320 may result in no errors being detected, meaning that the data symbols sent from the LDPC decode step were clean and that now they are certified as such. Therefore, the method 300 proceeds directly to the point where data symbols are transferred to the buffer, as denoted at step 326.

The data symbols transferred to a buffer, at step 326, are clean because prior decoding steps, culminating in the ECC decode step 320 have certified that resultant data is error free, at least insofar as errors are detectable. At this point, the only information in the flow is a block of user data symbols. All overhead information involved in prior steps is no longer necessary. The block of user data is transferred into the buffer 142 where it becomes available for subsequent transfer to the host via the host interface 116.

Third, the ECC decode step 320 may result in the detection of more errors in the user data plus ECC parity than the ECC correction calculations can repair. The outcome requires an abort and an exit to an error-handling step 328.

Figure 4:
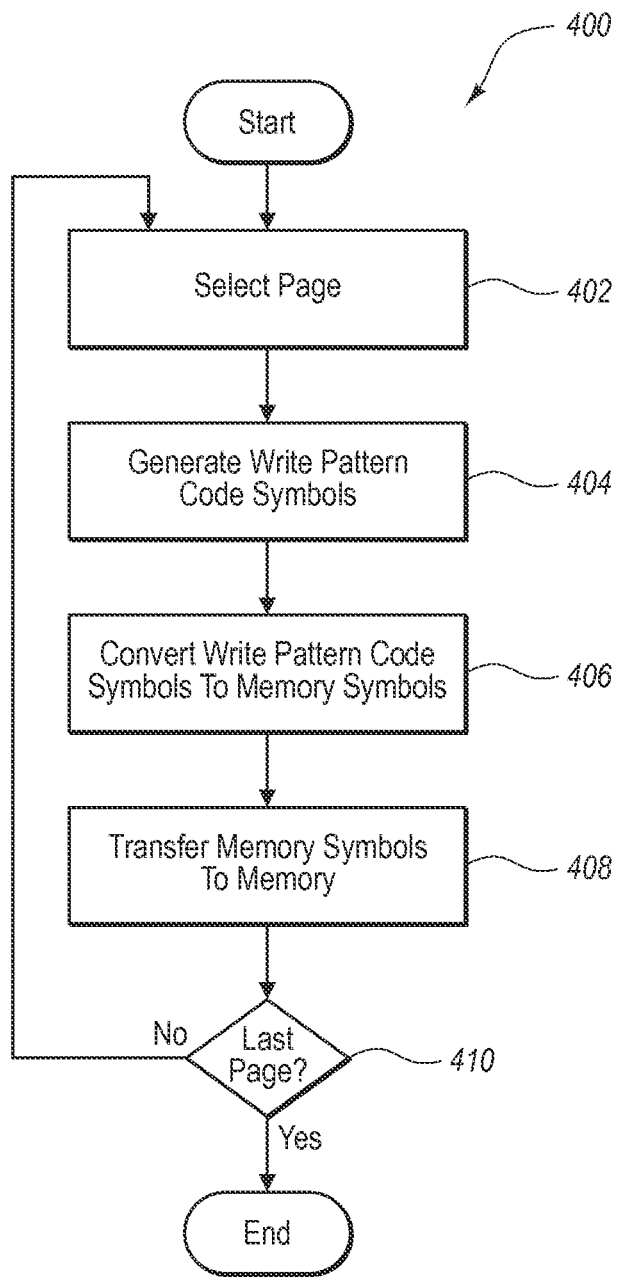
FIG. 4 illustrates one example of a method for developing information that forms the basis for compensation when reading data from a storage media.

Referring now to FIG. 4, an example of a method 400 is illustrated for developing information that forms the basis for subsequent use in compensation. In one embodiment, this information can be developed using predetermined patterns that are written to the memory cells and then read back. Pre-compensation is part of the data write flow (e.g., method 200 in FIG. 2), and post-compensation is part of the data read flow (e.g., method 300 in FIG. 3). In either case, the information applied to data symbols during write and read flows, as part of pre-compensation and post compensation may be obtained from a calibration procedure, such as the procedure illustrated in FIG. 4.

The method 400 begins by selecting the particular page of data to which the write step will be applied, as denoted at 402. In one embodiment, a page of memory refers to a physical layout of memory that corresponds to the size of one block of data. Calibration may be performed in various ways to pages of data that undergo storage. Ultimately, the strategy of which pages to write may be implemented in firmware 106 running on the microcontroller subsystem 108 (see FIG. 1). A particular page may be designated, for example, by establishing an address value.

The method 400 further includes, at step 404, applying known information patterns as write data to the memory device being calibrated. Particular sets of memory patterns may be used and their selection may be based on a choice of properties that are designed to return data for use in pre- and/or post compensation. Pattern code symbols can be distinguished from ordinary data code symbols by the fact that they can be algorithmically generated, by hardware, firmware, or a combination of both.

The method 400 further includes, at step 406, converting pattern code symbols to memory symbols. For example, the memory symbol encoder 130 of FIG. 1 and further detailed in FIG. 6 may be used for converting the code symbols. In one embodiment, patterns are generated from the set of data symbols in which each symbol is represented by a target charge level (described in further detail in FIG. 7). Other embodiments may generate patterns from an extension to the set of data symbols wherein the total number of target charge levels is greater than the number of charge levels in the set of data symbols alone. An extension to the set of data symbols can include other target charge levels, which are intermediate between predefined target levels that are associated with data symbols. Other embodiments may generate patterns exclusively from the same set of code symbols used for data.

The method 200 also includes, at step 408, transferring memory symbols to the memory. The memory symbol write module 152 may transform memory symbols into corresponding charge levels that are to be loaded into memory cells.

Figure 5:
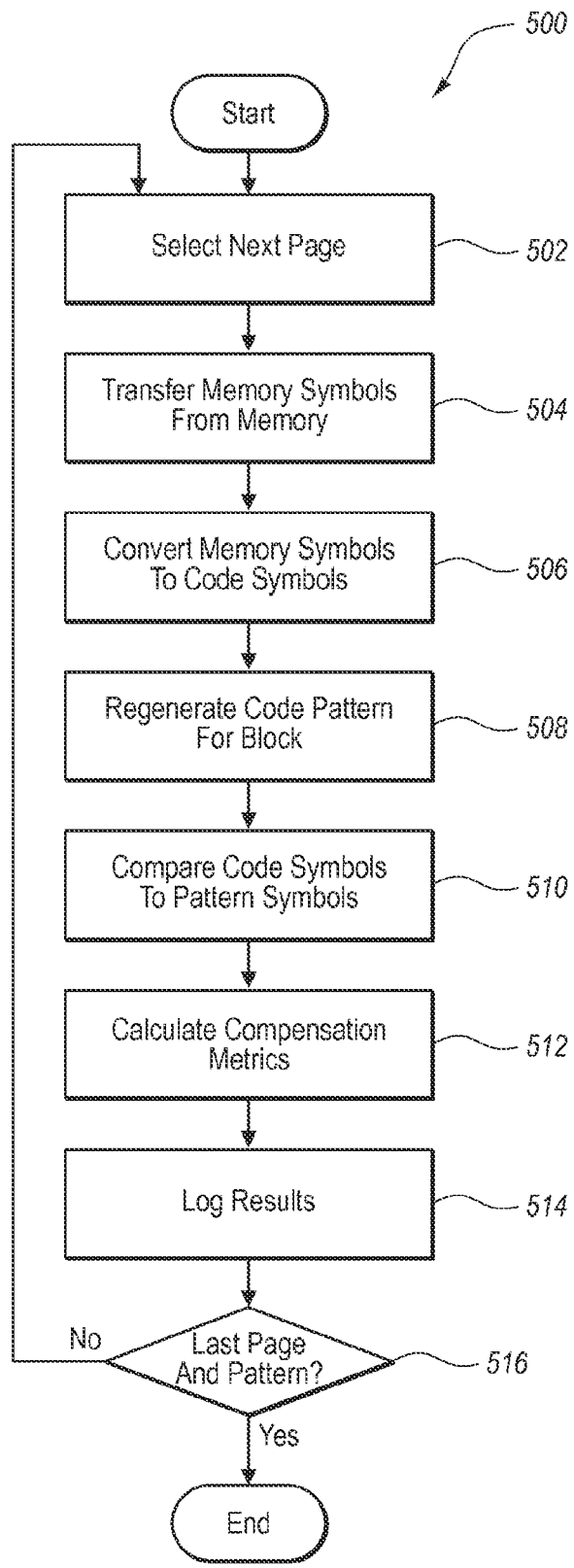
FIG. 5 illustrates one example of a method for developing information that forms the basis for compensation when writing data to a storage media.

FIG. 5 illustrates one example of another method, denoted at 500, for developing information that forms the basis for subsequent use in compensation. The method 500 may be used in conjunction with the calibration write flow method 400, illustrated in FIG. 4. That is, the calibration read flow method 500 may examine patterns that have been written to memory by the calibration write flow method 400 for the purpose of generating the information that is used to perform pre-compensation and post-compensation. Pre-compensation may be part of the data write method 200 (FIG. 2), and post-compensation may be part of the data read method 300 (FIG. 3).

The method 500 begins by selecting the particular page from which calibration data will be read, denoted at step 502. In one embodiment, the method 500 may assume that the selected page has previously been written by application of the calibration write method 400 (FIG. 4) so that calibration data is stored in and available from the selected page.

The method 500 further includes, at step 504, transferring memory symbols from memory. For example, and in one embodiment, a process may be undertaken by the controller 102 with the selected page in the selected memory device 104 which returns a page of memory symbols to the memory symbol decoder 126.

The method 500 further includes, at step 506, converting each memory symbol obtained during the previous step 504 to a code symbol recognizable as such by the remaining sections of the controller 102. In one embodiment, this step 506 uses the memory symbol decoder 126 of FIG. 1, which is further detailed in FIG. 6. On the basis of introduced errors, the code symbols obtained from this step may or may not be the same as those originally transferred during the calibration write method 400 (FIG. 4).

The method 500 further includes, at step 508 regenerating a code pattern that was written to the memory devices 104 during a prior calibration write method 400 (FIG. 4), so that a comparison with the corresponding read pattern can be performed. Because it should have the same pattern as was written, the hardware and firmware functionality that generate the pattern during the method 500 can be the same as that which generated the pattern as part of the calibration write method 400.

The method 500 also includes, at 510, comparing the sequence of pattern code symbols generated at step 506 (which is a representation of the actual data that is stored in memory) to the pattern code symbols regenerated in step 508 (which corresponds to the data pattern that was written). This comparison is the source of information that ultimately is used for pre-compensation during the data write method 200 (FIG. 2) and post-compensation during the date read method (FIG. 3). A difference value can be produced by comparing each regenerated symbol with each corresponding code symbol received from the memory device.

The difference values may then be used to calculate compensation metrics, as denoted at step 512. The difference data values may be used in a variety of ways, but derive ultimately from distortion and noise mechanisms that are a function of the data patterns themselves and of the relative position of the bits in the code symbols with respect to the overall block sequence of code symbols. That is, these distortion and noise mechanisms represent performance characteristics that are repeatable and, therefore, compensatable. As such, the step 512 analyzes difference values from the previous step and their relationships with the original code patterns written to the memory device. The result of this analysis can be to calculate a compensation metric corresponding to each code symbol position. Hence, at this step, the result can be a compensation metric accompanying each code symbol.

At step 514, the results from the compensation calculations may be cataloged into a data structure that may reside on one or more of the plurality of memory devices 104 or stored in any suitable location. The particular data structure can be an aggregation of the metrics accumulated for each block to which the calibration flow has been applied. The aggregation process may include several approaches that vary according to the particular memory device technology and according to pre/post compensation criteria. These criteria may include, but are not limited to: (1) compensation offsets that are associated with specific code symbols, (2) compensation offsets that are associated with code symbol positions within a page; and (3) code symbol offsets that apply across a page as a function of symbol position within the page that is calculated from calibration difference data.

In the case of (1) above, the effect can have to do with the occurrence of a distortion which occurs on some code symbols but not others, such as when storing to a higher target charge level in the range of target charge levels being applied to a memory cell returns a lower than expected level when sensed during read back due to a predictable distortion mechanism which occurs at the targeted charge level. In the case of (2) above, the effect can have to do with a distortion that occurs as a function of the position of a memory cell within a page. An example of (2) is resistance between the sense amplifier and the particular memory cell being sensed. In the case of (3) above, the effect may be due to memory cell differences that apply as a function of the page, i.e., offsets to sensed memory cells vary according to the particular page. Compensation offsets can also vary across each of the plurality of memory devices 104 as a function of memory block position within each memory device, and so the data structure has a partitioned organization that discerns the plurality of memory devices 104 on a device by device basis, and which discerns each block within a particular memory device according to the underlying block structure within that memory device. In one embodiment, an offset is a plus or minus value that is referenced to the correct or base value of a discrimination level. In other words, the offset characterizes a charge variation in one or more discrimination levels of a particular cell or cells. The offsets can be applied, for example, in the memory symbol domain.

The calibration process can accumulate compensation information as a result of writing and reading known data patterns to a subset of the data pages available on the plurality of memory devices 104. This is representative of an embodiment that attempts to minimize the execution time for the calibration flows by developing compensation information using a subset of all available data pages of the memory devices 104 and generalizing to the entire set of data pages based on the compensation information. It should be appreciated that this approach is effective when a selected sample of data pages is statistically sufficient to represent the totality of data pages. However, other embodiments can execute calibration to develop compensation information based on all pages in each of the plurality of memory devices 104. In any event, the data on which pre/post compensation is performed can itself be pre-established and later asserted during read and/or write operations.

Generally, memory cells may appear to be identical with respect to one another, either in a given array or from one memory device to the next. However, the memory cells can vary with respect to one another based on one or more repeatable performance characteristics in reading from and/or writing to the memory cells. Compensation, as taught herein, may be based on accessing an arrangement of memory cells to characterize the performance characteristic relating to at least one memory cell to establish an actual value of the performance characteristic of the arrangement of memory cells for the selected cell array device and for subsequently accessing the selected cell array device based on the actual value of the performance characteristic. The performance characteristic can be measured and developed using any desired number of memory cells such that different values of the performance characteristic can be produced by different memory cells. Thus, one memory cell may be accessed based on one value of the performance characteristic while a different memory cell may be accessed based on a different value of the performance characteristic.

Further, any number of different performance characteristics can be measured for use in the compensation process. Where a controller 102 is connected with more than one memory device 104, different values of a performance characteristic can be measured corresponding to different ones of the memory devices 104 and, thereafter, be applied for compensation purposes. As described herein, compensation can be applied as pre-compensation during a write operation and/ or as post compensation during a read operation. It is noted that pre-compensation and post compensation, as discussed, can both be performed on the same data. Pre-compensation may be performed on data prior to writing it to a memory device 104, and post compensation may be performed on data after reading it from a memory device 104. Various embodiments may perform pre-compensation alone or post compensation alone, or both pre-compensation and post compensation.

As an example of the application and operation of pre-compensation, an arrangement of memory cells may be accessed in a read operation to establish a current amount of charge that is stored by a particular cell and which current amount of charge is associated with an actual data value. Assuming that a performance characteristic has been measured as it applies to the particular cell, a corrected data value for the particular cell is established based on the current amount of charge and the measured value of the performance characteristic where the corrected data value is different than the actual data value to correct for an influence of the performance characteristic.

As an example of the application and operation of post compensation, an arrangement of cells may be accessed in a write operation for the purpose of writing a given data value to the particular cell, that is associated with a given amount of charge in any given one of the cells when the given amount of charge is present during a read operation. The write operation is based on using a write parameter having a predetermined value that is associated with the given data value. Examples of useful write parameters include time, voltage and current, since any of these can influence the amount of charge that is ultimately stored in a memory cell, responsive to a write operation. However, an actual amount of charge that is written to the particular cell can change proportionally with changes in a performance characteristic. Accordingly, the write parameter is adjusted and a different or adjusted value of the write parameter is used, based on the performance characteristic such that the actual amount of charge, that is established in the particular cell, more closely matches the given amount of charge that corresponds to the given data value.

The two diagrams of illustrated in FIGS. 6a and 6b illustrate techniques in a memory symbol encoder 130 and a memory symbol decoder 126 by which symbols stored in memory media can be encoded and decoded, respectively. These processes can be adjusted with respect to the number of target charge levels (discussed in further detail in FIG. 7 below) in any given embodiment so that memory symbols produced by the memory symbol encoder 130 and decoded by the memory symbol decoder 126 are consistent with the number of target charge levels of all possible memory device configurations to which the encoder and decoder are to be applied, as described for FIG. 7.

As seen in FIG. 6a, a memory symbol encoder 606 receives a block of code symbols 602 as input and produces a block of memory symbols 604 as output. Essentially, FIG. 6a represents a transform from a binary, code symbol domain to a memory symbol domain. The block of code symbols 602 is treated as an n-symbol sequence of digits whose numeric radix is an integer multiple of 2. Embodiments may receive each block of data as a sequence of symbols of m-bits per symbol, where m can be 1 or greater. If m=1, the radix of each received symbol is 2; if m is greater than 1, then the radix of each m-bit symbol is 2 m. All representations of input symbols with m=1 and greater are equally valid in practical embodiments. The output of this step is a block of symbols 604, in which p is the block length for symbols having radix=q, and for which valid values for q are integers greater than or equal to 2. Each symbol, s, may be comprised of (rounded up to the nearest integer) bits, or each symbol s may be represented as a single signal with one of q analog levels. That is, each memory symbol 604 corresponds to a unique value of charge in a memory cell as exemplified by the number of target charge levels, and there is not necessarily a one-to-one correspondence between the number of code symbols 602, that is available and the number of memory symbols.

As illustrated in FIG. 6b, a memory symbol decoder 608 receives a block of memory symbols 610 as input and produces a block of code symbols 612 as output. This function is the reverse of that performed by the memory symbol encoder 606, in that it maps a series of memory symbols 610 into a stream of code symbols 612. The block of memory symbols 610 is represented as a sequence of digits, whereby each s has a numeric radix of q, and may be represented by either a single signal whose value is one of q possible levels, or by a symbol comprised of (rounded up to the nearest integer) binary digits. The output is a block of n m-bit symbols. Each in the output symbols sequence is a code symbol 612 as discussed in the description of FIG. 3, and the value of m is an integer greater than or equal to one.

Figure 7A:
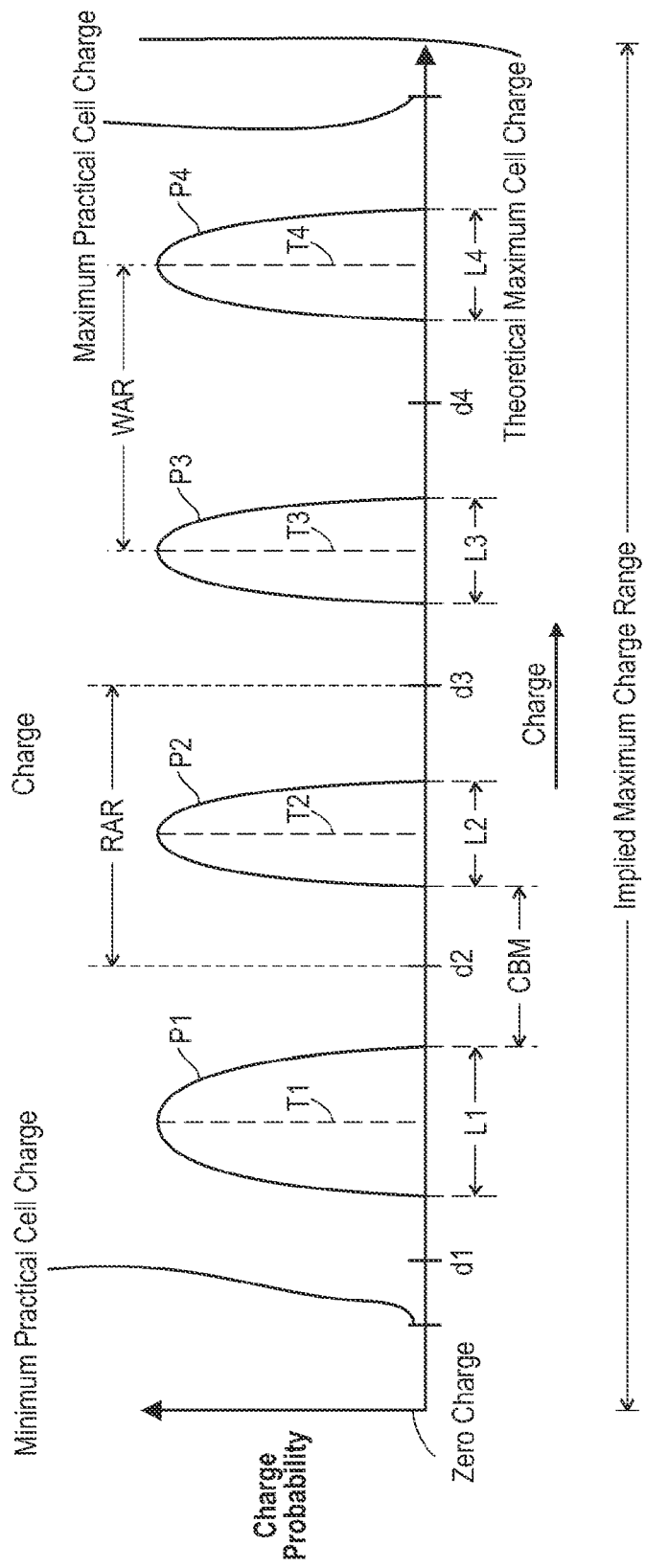
FIGS. 7a, 7b and 7c illustrate example plots of three variations of memory cell recording.
Figure 7B:
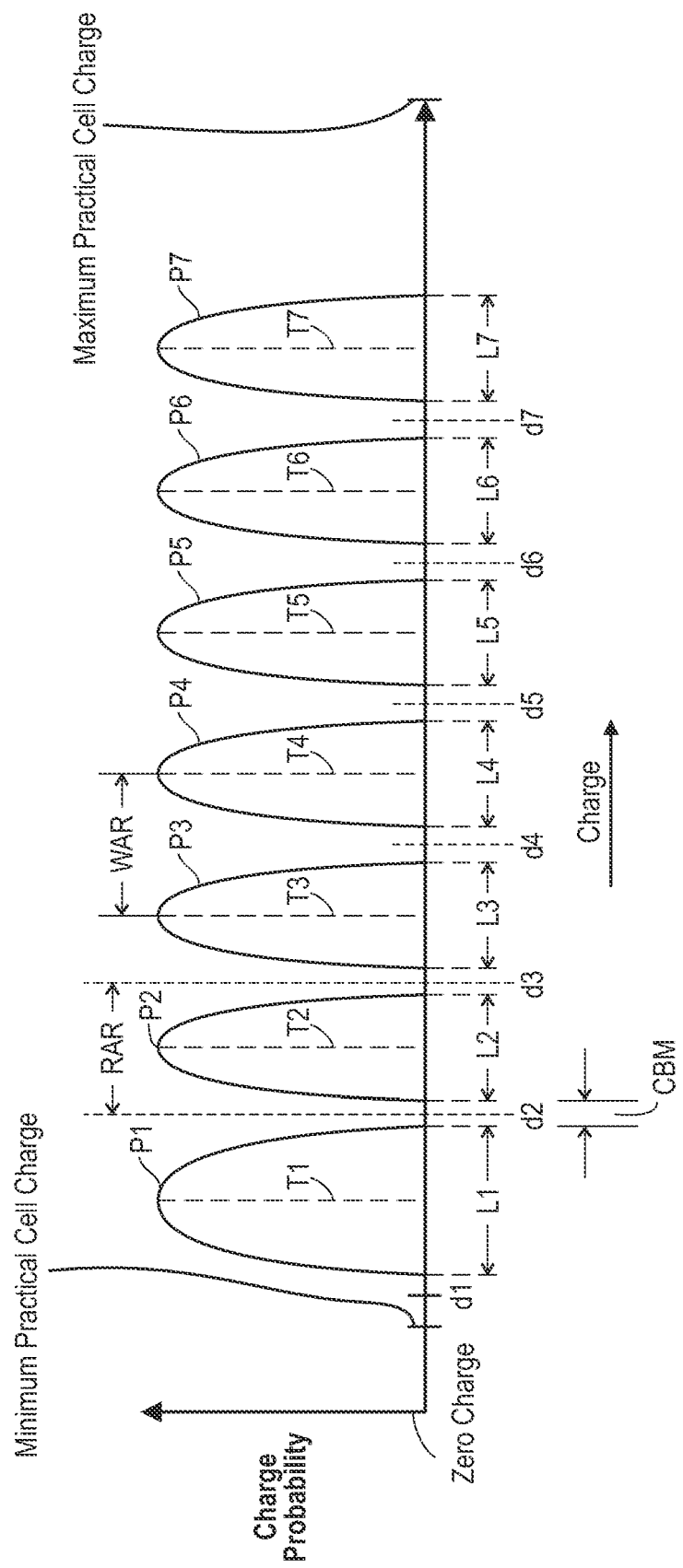
Figure 7C:
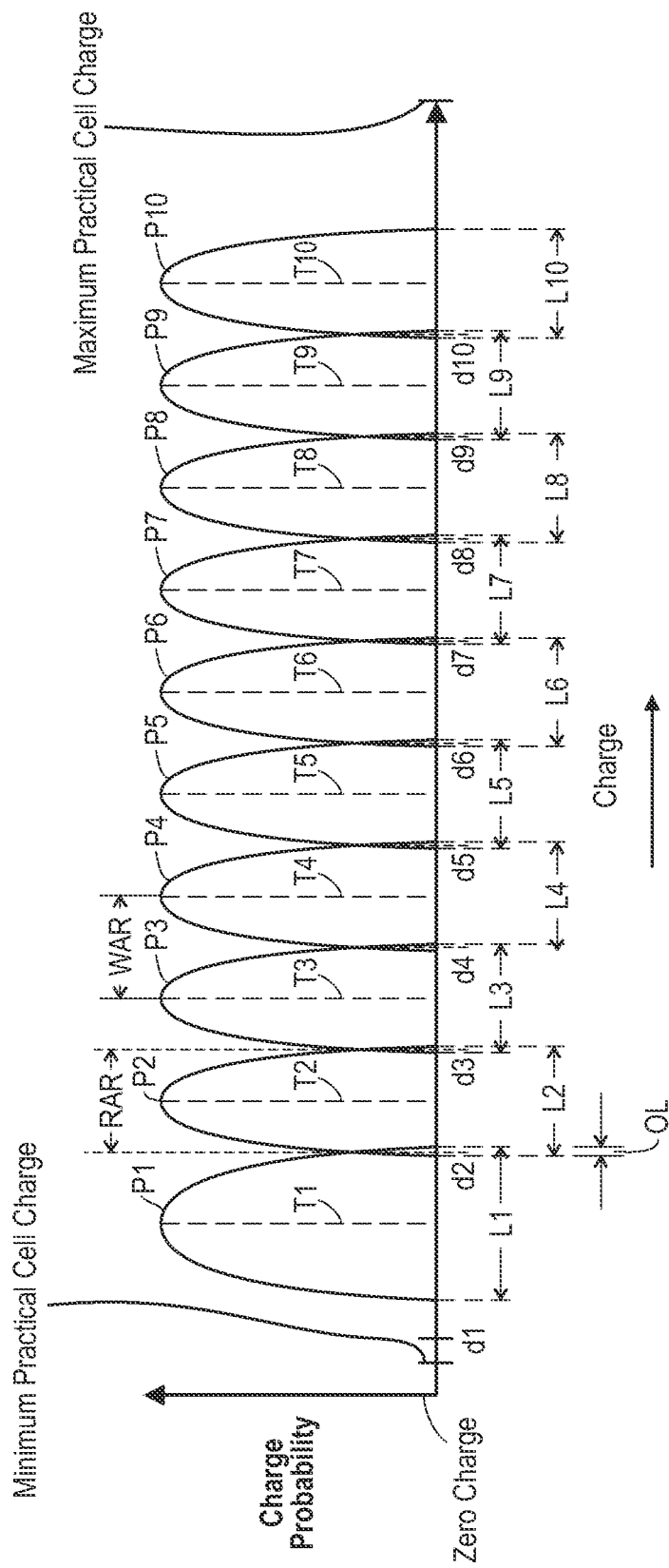

FIGS. 7a-c illustrate three variations of per-memory-cell recording. The horizontal axis of each figure corresponds to the magnitude of stored charge, while the vertical axis corresponds to probability for achieving a particular or target value of charge. All three variations in FIGS. 7a-c show representations of probability patterns or potential charge distributions that can arise from attempting to record information recorded in a memory cell at a target value of charge. Each of FIGS. 7a-c, by way of non-limiting example, represents a potential use of the overall charge range capability of a given memory cell for purposes of storing information. The specific amount of information storage capability increases with each figure, as will be seen.

Referring to FIG. 7a, each cell is characterized by minimum and maximum practical charge levels which lie within a maximum range implied by the physical design of memory cells comprising the memory device. The difference between the maximum and the minimum is considered as a useful range of charge for the memory cell and is to be applied using a set of levels T1-T4, shown as dashed lines. Each of the levels T1-T4 are divided by a set of discrimination levels d1-d4. In the present example, each level T1-T4 lies between maximum and minimum levels possible for the memory cell, and in general, the target charge levels can be equally spaced from one another. The memory cell may be programmed to any of the target charge levels that lie between these two extremes. That is, each cell may be loaded with charge having intent to achieve one of the target charge values in the memory cell. In doing so, the amount of charge in the cell falls within a range of charge that correlates with a given one of the target charge levels. Charge probability curves or distributions P1-P4 represent probability distributions of recorded levels that might be achieved in a particular cell associated with each target charge value. The target charge level for a distribution lies at least approximately at the center of the curve that defines the probability distribution.

Each cell may be programmed so as to attempt to achieve just one target charge level at any given time. However, any one of a plurality of levels may be chosen (four, in the present example), and the number of levels comprising the plurality is determined by the properties and configuration of the particular memory device 104 (FIG. 1) and the set of processes provided by the controller 102. Thus, each charge probability distribution, P1-P4, represents the range of possible charge that may actually result when it is attempted to load a cell with a given target charge level such that the charge storage arrangement of FIG. 7a is capable of storing four distinct values, thereby corresponding to two bits in binary terms.

Having generally described FIG. 7a, additional details will now be provided with respect to the storage capabilities that it provides. While FIG. 7a shows four levels, other numbers of levels, greater or lesser than four, may also be selected in different implementations. It is of interest to observe that, in the configuration of FIG. 7a, each charge level or range, L1-L4, is separated and spaced apart from the nearest adjacent level by a clear margin which denotes a charge buffer margin (CBM). Each curve P1-P4 represents a likely probability distribution of samples relative to the targeted discrimination level (d1-d4). In detecting the recorded level in a particular cell, the sensed value is expected to be sufficiently near to its target charge value, by falling on one of the illustrated curves, to preclude the possibility of ambiguity as to which charge range is actually represented, as a result of the wide charge buffer margin that is present between adjacent charge ranges. The large relative separation between target charge values, therefore, ensures reliability in the retrieval of stored data without the need for additional resolving mechanisms. Stated in another way, detection of charge of any given value is uniquely associated with a particular discrimination level (d1-d4). The intent of conventional systems has typically been to completely avoid the possibility of ambiguity as to a particular data value that is associated with reading a particular value of charge in a memory cell.

Turning now to FIG. 7b, a modified use of memory cell charge range is illustrated, which can use the same memory cell as was used in the example of FIG. 7a. One difference, when compared to FIG. 7a, resides in the presence of more discrimination levels (d1-d7) distributed across the same available charge range. Thus, charge probability curves P1-P7 appear essentially identical, that is, with the same width along the horizontal, charge axis. However, this necessitates a reduction in CBM such that the curves are closer to one another than in the illustration of FIG. 7a. Although the probability distribution associated with each target charge value does not overlap with the probability distribution of its nearest neighbor(s), the reduction of margin between target levels means that each curve is much nearer to its associated discrimination values and, therefore, the precision of a read process should be higher. In this regard, pre-compensation and post-compensation processes can serve to maintain precision in sensed levels by compensating for distortion mechanisms.

An effect not shown by FIG. 7b is the fact that various physical processes, including aging and high-temperature effects, can cause discrimination levels to change position along both axes. These changes are characterized on the one hand by a leftward shift along the x-axis of the distributions shown in FIGS. 7a-7c due to processes associated with aging and temperature. Other physical processes may cause a flattening of the shape of the distributions in FIGS. 7a-7c with respect to the y-axis. These changes are potentially an additional source of data errors, which may benefit from compensation and error correction.

Still referring to FIG. 7b, seven discrimination levels are provided with associated target charge values. It should be appreciated that this corresponds to a non-integer power of two. As mentioned above, the controller 102, described herein, readily accommodates this arrangement. Where each target charge value is associated with a symbol, there is no constraint on representing this in digital form insofar as the memory cell is concerned. Of course, if the number of symbols is mapped to binary form, a sufficient number of bits must be employed. In the present example, three bits are needed.

Referring now to FIG. 7c, a further modified use of memory charge cell range is illustrated, which again can use the same memory cell as was used in FIGS. 7a and 7b. In this example, there are even more discrimination levels than in either of the other two configurations. Specifically, ten discrimination levels d1-d10, target charge values T1-T10 and associated charge probability curves P1-P10 are shown which can correspond to ten symbols. Again, a non-integer power of two is used as the number of symbols. Significantly, probability charge curves now overlap to a limited degree such that a charge value that is read in an overlap range (OL) between adjacent ones of the charge probability curves is ambiguous in view of the position of d1-d10. Stated in another way, the CBM now has a negative value. In the present example, it is uncertain for the designated position of OL whether the charge value should be interpreted as corresponding to T1 or T2.

Although the majority of read samples obtained from the FIG. 7c configuration still are arranged so no ambiguity exists about which discrimination levels they represent, a percentage of charge samples, falling within the footprint of overlap regions on the horizontal charge axis are now uncertain as to the charge probability curve to which they should correspond. From a theoretical standpoint, the overlap footprint can approach one-half of the distance between adjacent target charge values. In this way, the probability of correctly interpreting a given charge value reading is more than 50% likely of being correct.

From a practical standpoint, there is a balance between accuracy and storage capacity that should be considered. Metrics denoting the introduced ambiguity are determined by the particular probability distributions for the set of target charge values. With regard to the configuration shown in FIG. 7c, conventional systems typically require substantially absolute accuracy in being able to discriminate between adjacent charge probability curves. In accordance with the concepts that have been taught herein, reliability of stored information is maintained through the teachings herein in spite of the overlap in probability distributions. In particular, this reliability can be produced through the use of the sequential encode/decode (FIG. 8), LDPC encode/decode (FIG. 1), and ECC encode/decode (FIG. 1) functions in the controller 102 (FIG. 1), either independently or in a suitable combination. That is, these correction processes can use the encoding and decoding process in a sequential manner and the error correction processes of LDPC and ECC (FIG. 1) to discover and correct deviations that occur.

Referring collectively to FIG. 1 and FIGS. 7a-c, a number of benefits are provided through the practice of the teachings herein. It is initially noted that the discrimination levels and target charge values of FIGS. 7a-c, and thereby the CBM, are soft. That is, these values may be established using the firmware 106 of FIG. 1 for controlling a processing configuration. Accordingly, these values are readily changed at will. There may be a limitation on the minimum charge separation between adjacent target charge values and adjacent discrimination values that is established, in the present example, by the capability of the memory symbol read 122 and memory symbol write modules 152 of FIG. 1. This minimum charge separation between adjacent discrimination levels is termed as the read access resolution (RAR) whereas the minimum charge separation between adjacent target charge values is termed as the write access resolution (WAR). These two forms of access resolution cooperate to define an overall device access resolution, which can be the lesser of the two. Accordingly, the firmware instruction that establishes the data capacity of each memory cell can readily switch to a different data capacity in a programmable manner. The upper limit of the data capacity is based, at least in part, on the WAR and RAR values. The cooperation between a particular WAR value and a particular RAR value results in the device access resolution and what can be termed as a charge tier. For example, the arrangement illustrated by FIG. 7c is representative of ten charge tiers. It should be appreciated that, in establishing a particular capacity and charge tier structure, the device access resolution may be applied in a step-wise manner to the charge range of a memory cell or range of memory cells.

Referring to FIGS. 7a-c, a given discrimination level or target charge value is "soft" and can be moved by the instruction set. In comparing FIGS. 7a and 7b, it can be seen that both T1 and d1 move to lower values of charge in FIG. 7b. Their values correspond to still lower amounts of charge in FIG. 7c. As another capability, the overall number of charge tiers can be changed at will. For example, a progression from FIG. 7a to FIG. 7c represents adding charge tiers. The reverse progression, of course, represents deleting charge tiers. The ability to programmably change the charge tier structure of any given cell provides for a remarkable degree of flexibility. Through this programmable capability, a given configuration of hardware can be used to implement a wide variety of charge tier structures. By way of example, this programmability could be realized by the action of firmware 106 (FIG. 1) through an algorithmic process that chooses a tier structure and applies it by writing appropriate parametric values into hardware registers. Different groups of memory cells in the memory array of a particular memory device may be configured with different charge tier structures at the same time (effectively using differing radix values, k, as described above). By way of non-limiting example, these different charge tier structures may be used to provide enhanced data reliability in a selected area of the memory cell array.

Figure 8A:
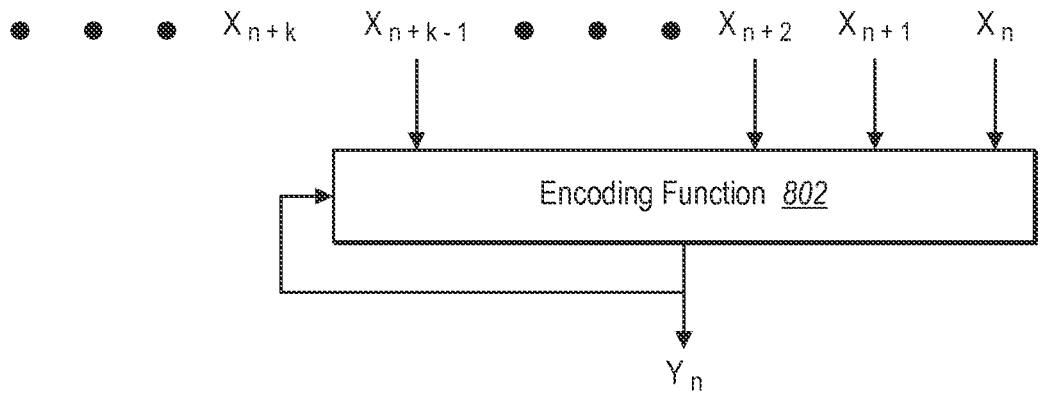
FIGS. 8a and 8b illustrate an example sequence encoder and an example decoder, as implemented in the controller illustrated in FIG. 1.
Figure 8B:
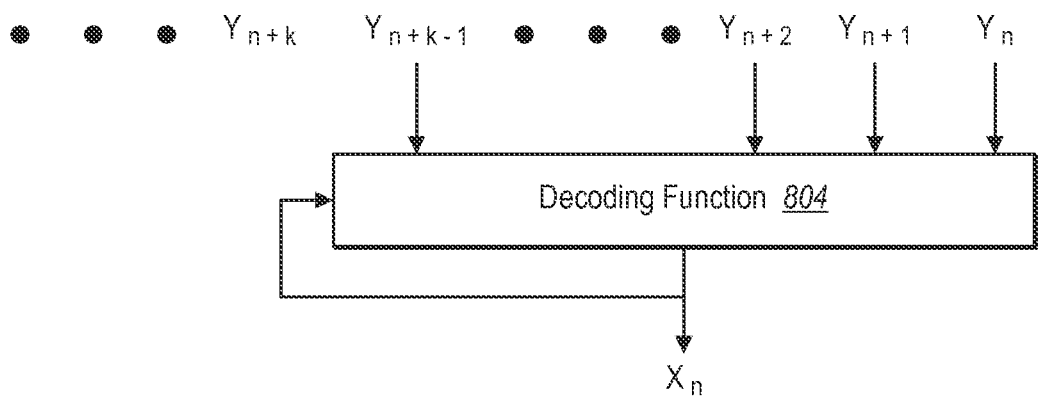

FIGS. 8a and 8b illustrate the concept underlying the sequence encoder 150 and decoder 134 as implemented in the controller 102 of the present disclosure. The encoding process illustrated in FIG. 8a converts a stream of un-encoded symbols into a stream of encoded symbols. The decoding process illustrated in FIG. 8b converts a stream of encoded symbols, which may be corrupted by noise and distortion, into a stream of un-encoded symbols with at least a portion of the noise and distortion removed. The encoded stream provides for possible removal of added noise and distortion because it is sequentially correlated. In other words, the value of a given encoded symbol is a function not only of the user data it represents, but also of the encoded symbols that precede it in the stream.

FIG. 8a shows one example of the encoding function 802. This function takes as input a stream of un-encoded symbols (usually user data in the form of a stream of bits or bytes) and generates, as output, a stream of encoded symbols. In the figure, input symbols are represented by a sequence of symbols $X_i$, with $X_n$ being the oldest symbol still in the encoder and $X_{n+k-1}$ being the most recently received symbol. Hence, it can be seen that the most recent k symbols are used to calculate the current output symbol, $Y_n$. The value k, is a design parameter that can vary with respect to the particular implementation. In addition, the current encoder output symbol, $Y_n$, is retained by the encoder, and is used by the encoding function 802 to calculate subsequent $Y_i$ symbols. Each input symbol X represents a unit of user data and may be referred to as a data symbol. Each X may be a binary bit, or a larger unit comprising a plurality of binary bits. Each Y may also be characterized by a binary bit or a plurality of binary bits, and it may also comprise a different plurality of binary bits than the number that characterizes each X.

In one embodiment, each Y generated by the encoding function 802 of FIG. 8a may or may not directly correspond to a memory symbol (FIG. 6). If the radix of the memory symbol and the radix of the encoded symbols are even multiples of one another, then the translation between encoded symbols and memory symbols shown in FIG. 6 may be trivial. However, in another embodiment, the encoded symbols and memory symbols may have radix values are not even multiple of one another. In this embodiment, a mapping from the encoded symbol stream $Y_i$ (code symbols) to the memory symbol stream $S_i$ (memory symbols) is performed by the encoding step shown in FIG. 6 and described above. The encoding process converts the input stream, which comprises a series of values $Y_i$ represented by binary coded digits with radix=n, to a stream of output values represented by digits with radix=p. Output values can be represented by binary coded values for the series of radix=q values, but may also be represented as a series of analog values each conveying one of the q discrimination levels.

FIG. 8b shows one example of the decoding function 804. In the decoding function 804, a stream of sequence-encoded symbols are obtained by the memory device read process and passed into the sequence decoder. The sequential decoding function converts the stream of $Y_i$ encoded symbols, which may include acquired noise and distortion, into a stream of $X_i$ user data symbols, with at least a portion of the acquired noise and distortion removed. One example realization of the decoding function 804 may include a Viterbi detector. Other realizations may also be used, as will be appreciated by one of ordinary skill in the art.

Figure 9A:
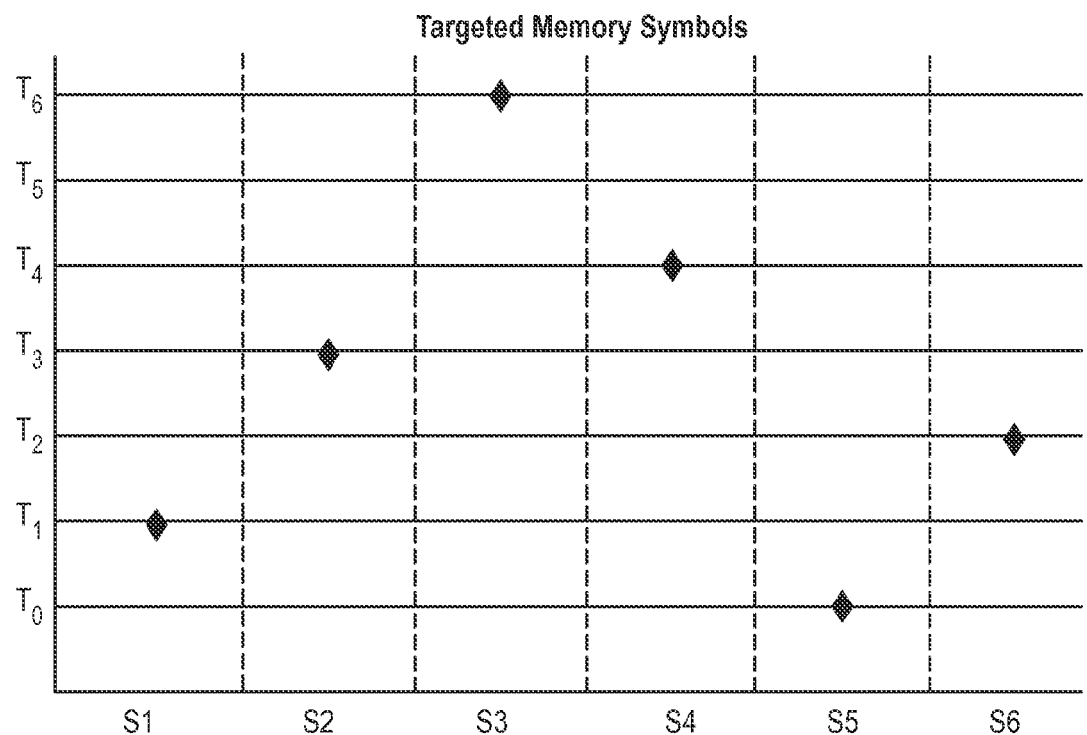
FIG. 9a illustrates a graphical representation of various states of memory cells and target charge values associated with data values.

FIG. 9a shows a graphical representation of various states of one or more memory cells for purposes of storing a set of target charge values that are associated with specific memory symbols. In the present example, seven target values T0-T6 are illustrated along the vertical axis while six stored charge states S1-S7 are illustrated along the horizontal axis. Accordingly, there are 7 target charge values, as illustrated. Horizontal lines in FIG. 9a represent the target charge values as they are arranged between maximum and minimum practical values (see also FIGS. 7a-c). These are relative levels in that they are relative to the practical maximum and minimum extremes that a given type of memory cell can practically achieve. The vertical distance between each horizontal line demarks the charge difference between adjacent target charge values. The charge states shown in FIG. 9a are ideal and are arbitrarily chosen to correspond to the target charge value that is associated with each memory symbol. As such, the illustrated charge states correspond to values which, in the absence of noise and distortion would be stored in and read from memory cells as the result of writing via the memory symbol encoder 606 (FIG. 6*a*) and retrieval via the memory symbol decoder 608 (FIG. 6*b*), respectively. It should be appreciated that the stored values are ideal for the reason that each value is disposed precisely on an intended one of the target charge values. In the present example, S1 stores T1; S2 stores T3; S3 stores T6; S4 stores T4; S5 stores T0 and S6 stores T2. Thus, FIG. 9*a* shows a succession of six target levels or values, all of which represent memory symbols with a radix of 7.

Figure 9B:
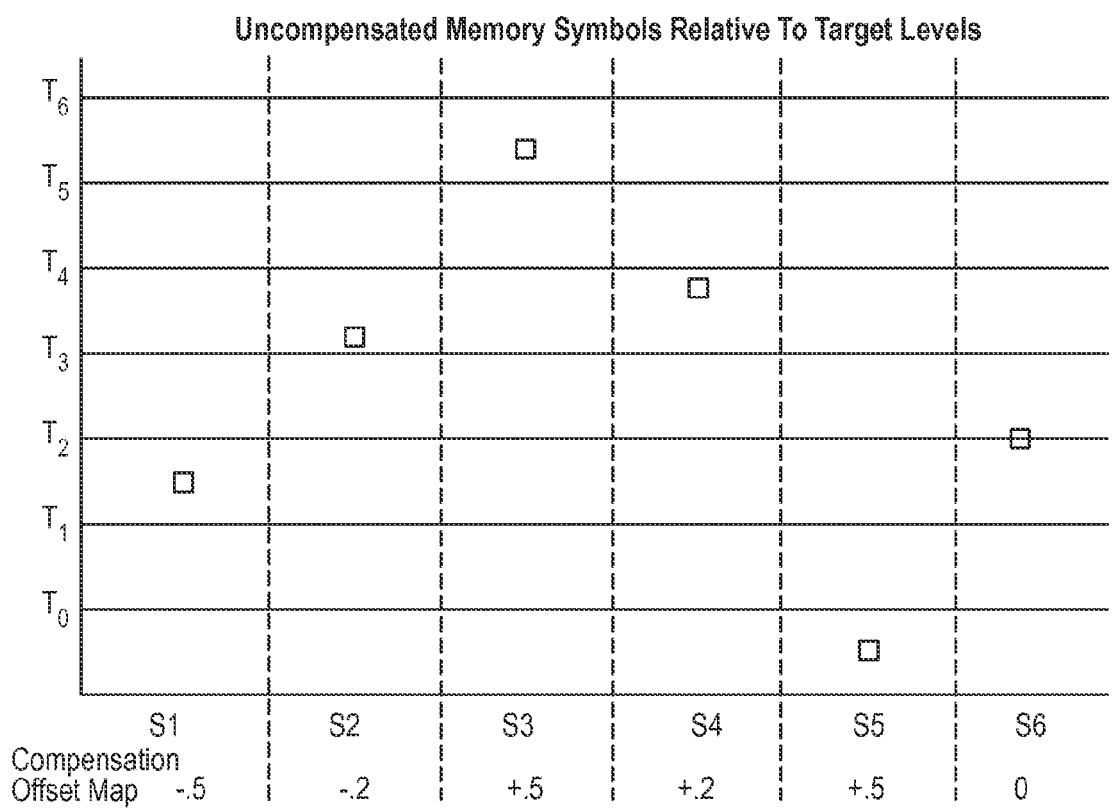
FIG. 9b illustrates a graphical representation of chare values stored in a memory cell that are representative of uncompensated values that have been read from the associated memory cell.

Referring now to FIG. 9*b*, a representation is provided of the same states as shown in FIG. 9*a*, but the stored charge values are instead representative of uncompensated values that have been read from the associated memory cell. FIG. 9*b* is provided to show the effect of distortion mechanisms that may be compensated for by pre-compensation or post-compensation. The distortion effects can influence the actual amount of charge that is stored as compared to an intended amount of charge that ideally corresponds to a target charge value. That is, the intended value of charge will not always reside precisely on an intended one of the target charge levels, but may be vertically offset, as shown in FIG. 9*b*. Those effects, which can reasonably be expected to be corrected for in a predictable way, are termed as "compensatable". Example methods for gathering parametric information used in pre-compensation and post-compensation calculations are represented in FIGS. 4 and 5, as discussed previously.

In the absence of compensation, the stored charge values in FIG. 9*b*, are returned as values which diverge from the ideal values shown in FIG. 9*a* and can fall intermediately between adjacent target charge values. In other words, the samples in FIG. 9*b* represent the memory symbols exemplified by FIG. 9*a*, that were intended to be stored. However the actual values that are read from the memory cells are seen to deviate from the targeted values, as illustrated, due to compensatable/repeatable effects in the write and read processes. The difference between the returned values shown in FIG. 9*b*, and the targeted/ideal values shown in FIG. 9*a* can be removed if a set of compensation offsets 902 (shown at the bottom of FIG. 9*b*) are either added to memory symbols before writing them into the memory device (pre-compensation), added to sensed memory symbols (post-compensation) or asserted in a combination of pre and post compensation.

It should be appreciated that the illustrated offsets can represent a map where each of the states in FIG. 9*b* is stored by a group of adjacent memory cells. The methods 400 and 500 in FIGS. 4 and 5 may be used in conjunction with calculations respective to compensatable distortion effects to develop parametric data for use during the actual compensation processes. During the compensation process, whether pre or post-compensation, is to calculate a map of offset values 902 that will be applied to the memory symbols comprising a page of memory cells. When multiple effects are subject to compensation using a distinct offset for each effect, one approach resides in establishing the offset that is associated with each effect and then summing the individual offsets for each of the effects in order to arrive at an overall offset. It is noted that an offset can be either negative or positive. Adding the compensation offset as either a pre-comp or post-comp step in the read/write flow cancels the effect of distortion mechanisms that cause the error and for which compensation calculations have been performed. The result is that errors caused by compensated distortion mechanisms can be removed.

Referring again to FIG. 1, this system 100 is considered to provide the capability for a higher storage density and lower unit cost of storage than what is seen in the current state-of-the-art with respect to nonvolatile electronic memory systems. One reason for this benefit is a reduced complexity (and, thereby, silicon area) of circuitry adjunct to the storage array in each S3E memory device, as compared to a typical conventional NAND flash device. Thus, each memory device affords a relative increase in memory media area relative to the area that is available in prior art NAND flash devices. That is, by moving functionality away from the memory devices 104 and onto the controller 102, each S3E memory device exhibits more storage capacity per chip silicon area than prior art NAND flash devices. For a constant die size and device cost, the effect is more storage per unit cost and, hence, lower cost per unit of storage. This effect becomes more pronounced when increasing numbers of memory devices 104 are connected in a system configuration with a single controller 102. Cost per unit of storage is further reduced by the capability to increase the number of distinct recording levels in the S3E memory device relative to prior art NAND Flash devices. In accordance with the teachings above, an arbitrarily large number of distinct levels may be used as compared a typical conventional memory device. While there may be a limit in per cell storage capacity that is related to the access resolution, as described above, the access resolution is capable of being enhanced to the point of distinguishing between very small charge differences in the memory cell.

Although increasing the amount of information that is stored per cell may be attended by a reduction in reliability, Applicants have resolved concern in this regard by recognizing that the use of optimized methods and processes in the S3E controller device 102 can enhance reliability of the Solid State Storage Element to the point that it is possible to exceed the reliability of combined prior art NAND Flash devices and on-chip NAND Flash Controllers. Through the concept of using a single controller 102 to operate a plurality of SE3 memory devices 104, the capabilities of the controller 102 have been remarkably enhanced to provide desired levels of data reliability capability. Moreover, these teachings are considered to sweep aside the prior art constraint wherein there is essentially no tolerance for error in write and read operations, as is exemplified, for example, by the use of wide charge buffer margins (see FIG. 7*a*).

Through the teachings above, it should be appreciated that the S3E controller 102 uses a fractional portion of the capacity of each of the plurality of S3E memory devices 104 to detect and correct instances of failure by said S3E memory devices 104 with respect to accurately storing and retrieving information. That is, this fractional portion may be used to store error correction information.

The embodiments described herein may include the use of a special purpose or general-purpose computer including various computer hardware or software modules, as discussed in greater detail below.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a computer-readable medium. Combinations of the above should also be included within the scope of computer-readable media.

Computer-executable instructions comprise, for example, instructions and data which cause a general purpose computer, special purpose computer, or special purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" can refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

It should be apparent that the embodiments and associated methods disclosed herein may be provided in a variety of different configurations and modified in an unlimited number of different ways, and that the present invention may be embodied in many other specific forms without departing from the spirit or scope of the invention. For example, as noted above, the concepts, as taught herein, are readily adaptable to essentially any type of memory cell that stores information in an essentially analog form, whether currently available or yet to be developed. Therefore, the present examples and methods are to be considered as illustrative and not restrictive, and the invention is not to be limited to the details given herein. The scope of the invention is, therefore, indicated by the appended claims rather than by the foregoing description. All changes which come within the meaning and range of equivalency of the claims are to be embraced within their scope.

What is claimed is:

1. A flash memory device comprising:
   flash memory; and
   a controller, the controller configured to:
     receive one or more memory symbols corresponding to data to be written, where each of the memory symbols identifies a charge level; and
     for each of the one or more memory symbols:
       perform one or more pre-compensation adjustments to modify the charge level identified by the memory symbol, the modification defined by a pre-defined rule corresponding to one or more of: a type of the flash memory and a calibration previously performed on the flash memory; and
       perform a write operation to the flash memory with the modified charge level.

2. The flash memory device of claim 1, wherein:
   each of the one or more memory symbols is from a set of possible memory symbols;
   the pre-defined rule is a rule from a set of at least two rules, wherein each rule in the set of at least two rules:
     corresponds to an item in the set of possible memory symbols; and
     has a pre-determined adjustment value to apply to the corresponding memory symbol during pre-compensation; and
   the adjustment value of at least one of the rules in the set of at least two rules is different from the adjustment value of at least one other of the rules in the set of at least two rules.

3. The flash memory device of claim 1, wherein:
   each of the one or more memory symbols is in a set of possible memory symbols; and
   the pre-defined rule defines a pre-determined adjustment value to apply to at least two of the items in the set of possible memory symbols during pre-compensation.

4. The flash memory device of claim 1, wherein the pre-defined rule corresponds to the type of the flash memory.

5. The flash memory device of claim 1, wherein the pre-defined rule corresponds to the calibration previously performed on the flash memory.

6. The flash memory device of claim 5, wherein the pre-defined rule identifies an adjustment value to apply to the memory symbol during pre-compensation adjustment, the adjustment value determined by the calibration previously performed on the flash memory by:
   applying a target charge level to a location in the flash memory;
   reading a stored charge level stored at the location;
   comparing the read charge level to the applied target charge level to determine a difference value; and
   calculating the adjustment value based on the difference value.

7. The flash memory device of claim 1, wherein the controller is further configured to:
   read one or more additional symbols from the flash memory corresponding to a read request, where each of the additional memory symbols identifies a value determined from an additional charge level stored by the flash memory; and
   for each of the one or more additional memory symbols:
     perform one or more post-compensation adjustments to modify the value identified by the memory symbol, the modification corresponding to an additional pre-defined rule; and
     provide, in response to the read request, the modified value.

8. A flash memory device comprising:
   flash memory; and
   a controller, the controller configured to:
     read one or more charge values from the flash memory in response to a read request, where each of the memory charge values is determined from a charge level stored by the flash memory; and
     for each of the one or more charge values:
       perform one or more post-compensation adjustments to modify the charge value, the modification corresponding to a pre-defined rule defining an adjustment value corresponding to a characteristic of the flash memory;
       determine a memory symbol corresponding to the adjusted charge value; and
       provide, in response to the read request, the determined memory symbol.

9. The flash memory device of claim 8, wherein two or more pre-defined rules are defined to provide different adjustment values each corresponding to a different memory symbol.

10. The flash memory device of claim 8, wherein the pre-defined rule defines an adjustment value to apply during post-compensation that compensates for persistent distortion or noise during read or write operations to the flash memory.

11. The flash memory device of claim 8, wherein the pre-defined rule corresponds to the type of the flash memory.

12. The flash memory device of claim 8, wherein the pre-defined rule corresponds to the calibration previously performed on the flash memory.

13. The flash memory device of claim 12, wherein the adjustment value is determined by the calibration previously performed on the flash memory by:
   applying to a target charge level to a location in the flash memory;
   reading a stored charge level stored at the location;
   comparing the read charge level to the applied target charge level to determine a difference value; and
   calculating the adjustment value based on the difference value.

14. A method for writing to a flash memory device using compensated values, the method comprising:
   receive one or more memory symbols corresponding to data to be written, where each of the memory symbols identifies a charge level; and
   for each of the one or more memory symbols:
      performing one or more pre-compensation adjustments to modify the charge level identified by the particular memory symbol, the modification corresponding to a first pre-defined rule; and
      storing the modified charge level to the flash memory device.

15. The method of claim 14, wherein:
   the one or more memory symbols comprise at least two memory symbols;
   the rule defines an adjustment value to apply to the particular memory symbol during pre-compensation; and
   the adjustment value is based on the order of at least two of the memory symbols.

16. The method of claim 14, wherein the pre-defined rule defines an adjustment value to apply during pre-compensation that compensates for persistent distortion or noise during read or write operations to the flash memory device.

17. The method of claim 14, wherein:
   each of the one or more memory symbols corresponds to a possible set of memory symbols; and
   the pre-defined rule defines a pre-determined adjustment value to apply to at least two of the items in the set of memory symbols during pre-compensation.

18. The method of claim 14, wherein the pre-defined rule corresponds to a type of the flash memory.

19. The method of claim 14, wherein the pre-defined rule corresponds to a calibration previously performed on the flash memory.

20. The method of claim 19, wherein the pre-defined rule identifies an adjustment value to apply to the memory symbol during pre-compensation adjustment, the adjustment value determined by the calibration previously performed on the flash memory by:
   applying to a target charge level to a location in the flash memory;
   reading a stored charge level stored at the location;
   comparing the read charge level to the applied target charge level to determine a difference value; and
   calculating the adjustment value based on the difference value.

* * * * *